United States Patent [19]
Stengl et al.

[11] Patent Number: 5,893,735
[45] Date of Patent: Apr. 13, 1999

[54] THREE-DIMENSIONAL DEVICE LAYOUT WITH SUB-GROUNDRULE FEATURES

[75] Inventors: Reinhard J. Stengl, Stadtbergen; Erwin Hammerl, Emmerting, both of Germany; Jack A. Mandelman, Stormville; Herbert L. Ho, New Windsor, both of N.Y.; Radhika Srinivasan, Ramsey, N.J.; Alvin P. Short, Poughkeepsie, N.Y.; Bernhard Poschenrieder, Saint-Cloud, France

[73] Assignees: Siemens Aktiengesellschaft, Munich, Germany; International Business Machines Corporation, Armonk, N.Y.

[21] Appl. No.: 08/742,533

[22] Filed: Nov. 1, 1996

Related U.S. Application Data

[63] Continuation-in-part of application No. 08/667,541, Jun. 21, 1996, Pat. No. 5,792,685, which is a continuation-in-part of application No. 08/605,622, Feb. 22, 1996, Pat. No. 5,827,765.

[51] Int. Cl.[6] .............................................. H01L 21/8242
[52] U.S. Cl. .................. 438/243; 438/245; 438/248; 438/249; 438/386; 438/388; 438/391; 438/392
[58] Field of Search .................................. 438/243, 245, 438/246, 247, 248, 249, 386, 388, 389, 390, 391, 392

[56] References Cited

U.S. PATENT DOCUMENTS

| | | | |
|---|---|---|---|
| 4,988,637 | 1/1991 | Dhong et al. | 438/245 |
| 5,055,898 | 10/1991 | Beilstein, Jr. et al. | 438/243 |
| 5,302,541 | 4/1994 | Akazawa | 438/245 |
| 5,627,092 | 5/1997 | Alsmeier et al. | 438/388 |
| 5,705,414 | 1/1998 | Lustig | 438/947 |
| 5,731,217 | 3/1998 | Kadosh et al. | |
| 5,744,386 | 4/1998 | Kenny | 438/245 |
| 5,780,332 | 7/1998 | Ozaki | 438/243 |
| 5,792,685 | 8/1998 | Hammerl et al. | 438/243 |

Primary Examiner—Peter Toby Brown
Assistant Examiner—Toniae M. Thomas
Attorney, Agent, or Firm—Stanton C. Braden

[57] ABSTRACT

Method for forming three-dimensional device structures comprising a second device having sub-groundrule features formed over a first device is disclosed. A layer having a single crystalline top surface is formed above the first device to provide the base for forming the active area of the second device, the sub-groundrule feature is formed using mandrel and spacers.

1 Claim, 19 Drawing Sheets

THREE-DIMENSIONAL DEVICE LAYOUT WITH SUB-GROUNDRULE FEATURES

This application is a continuation-in-part of a U.S. Ser. No. 08/667,541; now U.S. Pat. No. 5,792,685 (attorney docket number 96-P-7406-US01) filed on Jun. 21, 1996, titled "Three-dimensional Device Layout", which is a continuation-in-part of U.S. Ser. No. 08/605,622; now U.S. Pat. No. 5,827,765, filed on Feb. 22, 1996, titled "Buried-Strap Formation A DRAM Trench Capacitor", all herein incorporated by reference for all purposes.

FIELD OF INVENTION

The invention generally relates to devices and in particular, to three dimensional device layouts with sub-minimum feature size devices.

BACKGROUND OF INVENTION

In device fabrication, insulating, semiconducting, and conducting layers are formed on a substrate. The layers are patterned to create features and spaces, forming devices, such as transistors, capacitors, and resistors. These devices are then interconnected to achieve a desired electrical function. The formation and patterning of the various device layers are achieved using conventional fabrication techniques, such as oxidation, implantation, deposition, epitaxial growth of silicon, lithography, and etching. Such techniques are described in S. M. Sze, *VLSI Technology*, 2nd ed., New York, McGraw-Hill, 1988, which is herein incorporated by reference for all purposes.

The dimensions of the features and spaces depend on the resolution capability of the lithographic systems. The minimum feature size (F) achieved by a given generation of lithographic systems is referred to as the lithographic groundrule. As device manufacturers are continually pressured to increase the density of devices per chip while decreasing chip size, the placement or layout of devices becomes more important. An effective technique of decreasing chip size without changing the design rule is to fabricate devices in a three-dimensional design layout instead of the conventional two-dimensional format. In the three-dimensional layout, devices are fabricated over other devices. As a result, vertical and horizontal integration of devices is achieved, thus utilizing chip area more efficiently than the two-dimensional layout which only integrates the devices horizontally.

Certain factors are taken into consideration in order to determine the layout of the devices. These factors include the type and quality of material on which the devices are fabricated. As an illustration, certain devices, such as an access transistor in a dynamic random access memory (DRAM) cell, are fabricated on single crystalline material with low defect density due to their performance needs. The high carrier mobility and low leakage currents associated with the single crystalline material having low defect density satisfies the performance requirements of such devices.

However, the need to fabricate certain devices on high quality single crystalline material limits the effectiveness of three-dimensional design layouts. Some devices, such as trench capacitors, are formed with polycrystalline (poly) material. Unfortunately, the poly does not provide an adequate base for devices with high operating performance requirements. Such devices, in conventional design layouts, are located in areas next to the trench capacitors where single crystalline material exists, thus limiting the size-reducing effect of three-dimensional design layouts.

From the above discussion, it is apparent that there is a need to increase the available area of high quality silicon for improved three-dimensional integration of devices.

SUMMARY OF INVENTION

A method for facilitating a three-dimensional device layout is disclosed. The device layout includes a device structure comprising a first device and a second device formed thereon. The first device, for example, is a trench capacitor, and the second device has an active area which, for example, is a transistor. The first device is formed in a capacitor region defined on a substrate having a single crystalline structure with a pad layer formed thereon. The top of the first device, which comprises a non-single crystalline structure with a pad layer formed thereon. The top of the first device, which comprises a non-single crystalline material, is recessed below the surface of the substrate. As a result, a depression is formed in the substrate. An intermediate layer is formed in the depression by epitaxial growth techniques. In one embodiment, the epitaxial growth is selective to the substrate material and the top of the first device. Selective epitaxial growth focuses the growth of the intermediate layer in the depression. The intermediate layer typically is formed slightly above the plane of the pad layer. Epitaxial growth results in an intermediate layer having a single crystalline top surface. Planarization of the substrate produces a surface with a uniform planar topology. The second device is then formed on the single crystalline surface of the intermediate layer above the first device.

Formation of the second device, in one embodiment, comprises forming a transistor having a sub-groundrule gate. The sub-groundrule gate, is formed by, for example, depositing a wordline conductor and mandrel layer sequentially over the surface of the semiconductor substrate. The mandrel layer is patterned to form a mandrel such that a side edge of the mandrel overlaps a portion of the capacitor region. A spacer is then formed on the side edge of the mandrel. The spacer is then used to define a gate region within the capacitor region. Thereafter, the spacer and the portion of the wordline layer in the non-gate region are removed to form the sub-groundrule gate.

DETAILED DESCRIPTION OF THE INVENTION

The present invention relates to three-dimensional design layouts in device fabrication. For purposes of illustration, the present invention is described in the context of a transistor device formed over a trench capacitor device. However, the invention is significantly broader and extends to the fabrication of devices having three-dimensional layouts in general, such as a first device with a second device fabricated thereon.

Figure 1:
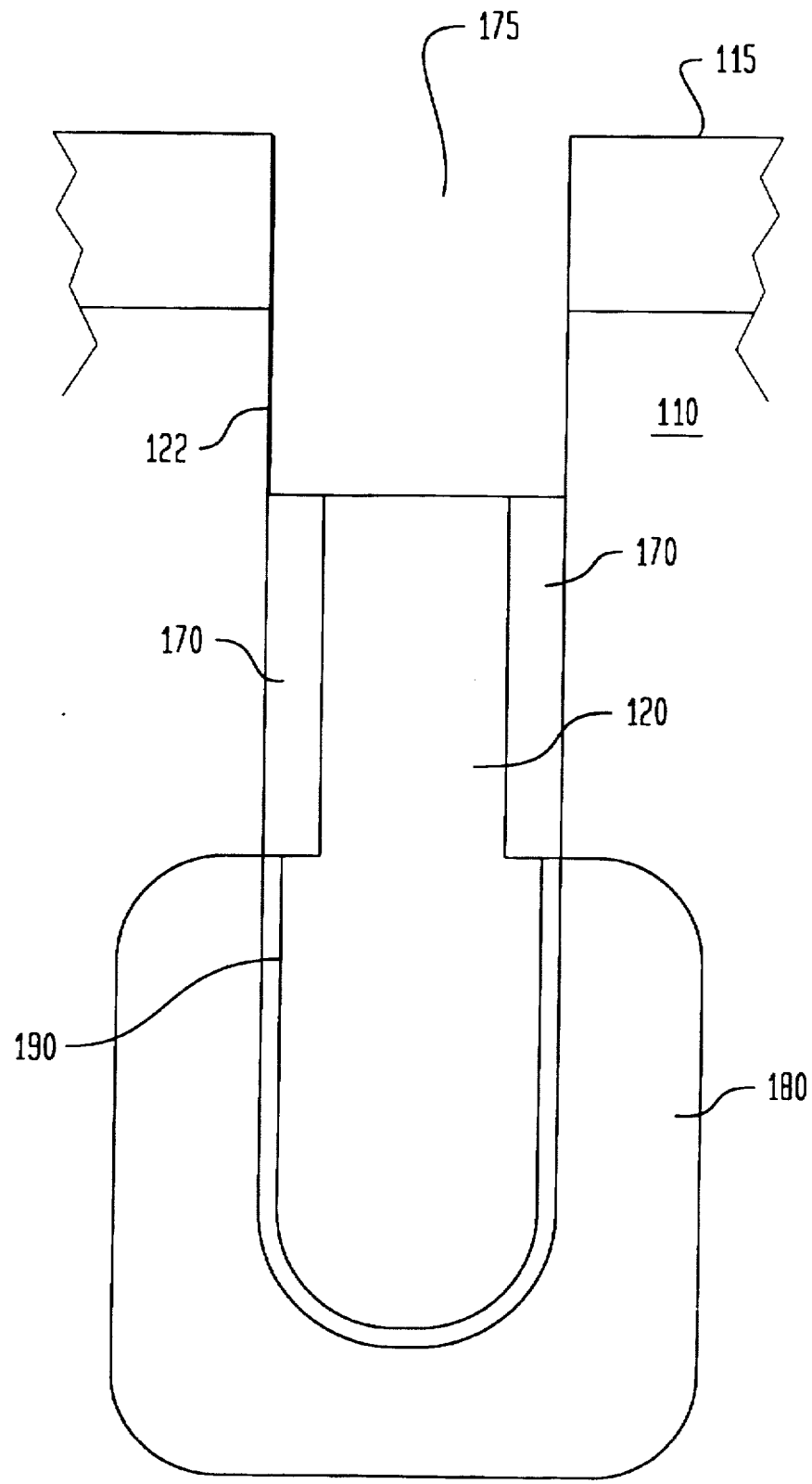
FIG. 1 shows a conventional trench capacitor.

Referring to FIG. 1, a trench capacitor fabricated by conventional techniques, such as those described in Nesbit et al., *A 0.6 µm² 256 Mb Trench DRAM Cell With Self-Aligned Buried Strap (BEST)*, IEDM Technical Digest (1993), which is herein incorporated herein by reference for all purposes, is shown. The capacitor is formed in a semiconductor substrate 110. Typically, the substrate is made from a single crystalline material. "Single crystalline material", as used herein, refers to a crystalline material in which the corresponding atomic planes are effectively parallel. Various materials which are well known to those skilled in the art are useful to form the substrate. Such materials, for example, include silicon, germanium, gallium arsenide, and group III-V compounds. Substrates that comprise a plurality of layers of material are also useful. These substrates, for example, include one type of single crystalline material formed on top of another type of single crystalline material (e.g., silicon on sapphire (SOS)), or amorphous or polycrystalline material recrystallized on a layer of amorphous material (e.g., silicon on insulator (SOI)).

In one embodiment, the substrate is a single crystalline silicon wafer prepared by the Czochralski technique. The major surface of the wafer is not critical, and any suitable orientation such as an <100>, <110>, or <111> is useful. Typically, the wafer has a <100> orientation because such a wafer is commonly available due to its low surface states and high carrier mobility. It is possible to heavily or lightly dope the substrate with impurity atoms, such as boron (B), phosphorus (P), arsenic (As), or antimony (Sb), to achieve the desired electrical characteristics.

In an exemplary embodiment, the trench capacitor is formed in a P-type <100> substrate doped with boron at a concentration of about $7 \times 10^{15} - 2 \times 10^{16}$. A pad nitride layer 115 is formed on the top surface of the substrate. The pad nitride forms an etch mask for the deep storage trenches and shallow isolation trenches. Typically an oxide layer (not shown) of about 80 angstroms (Å) is formed on the silicon substrate prior to the formation of the nitride layer. The oxide layer promotes adhesion of the nitride layer to the substrate and reduces stress at the interfaces of the layers. Capacitor 101 comprises a trench region 120 which is filled with polysilicon (poly). The poly is doped with an N-type dopant such as As at about $5 \times 10^{19}$. Although the trench, as described, is doped with As, those skilled in the art will appreciate that a P-type doped poly may be useful in some applications. For example, a P-type poly is used to achieve a one volt shift in work function.

A N-type buried region 180 surrounds the lower portion of the trench. The buried region creates a P-N junction with the P-type substrate, thus forming one plate of the storage capacitor, which is isolated from the substrate. To form the buried region, the lower trench region is lined with N-type doped material such as As doped glass (ASG). After subjecting the substrate to high temperatures of, for example, about 1050° C. for about 30 minutes, the As dopant atoms diffuse into the P-type substrate, completing the formation of the buried region. Buried region forms the other plate of the capacitor referred to as a buried plate. A node dielectric layer 190 separates the two plates of the capacitor. As shown, the node dielectric comprises a layer of silicon nitride ($Si_3N_4$) and silicon dioxide ($SiO_2$). The layers of the node dielectric are formed by deposition of $Si_3N_4$, typically via chemical vapor deposition (CVD), and re-oxidation. An oxide collar 170 is formed along the sidewalls of the trench above the node dielectric layer using, for example, spacer etching techniques. The thickness of the collar should be sufficient to isolate the storage capacitor from the array device. Typically, the collar thickness is about 25–50 nm. The collar and poly are recessed, creating a depression 175 in the substrate wherein the silicon trench sidewalls 122 are exposed. For a trench of about 8 µm in depth, the collar and poly are recessed about 150 nm below the silicon surface.

The above is an overly simplified description of the conventional trench capacitor and the process steps used in its fabrication for purposes of illustration. Of course, the formation of the actual trench capacitor involves many more steps, such as, for example, steps removing the node dielectric from under the collar and deposition and removal of ASG. These steps are well-known and are described in Nesbit et al., *A 0.6 µm² 256 Mb Trench DRAM Cell With Self-Aligned Buried Strap (BEST)*, IEDM Technical Digest (1993), which is already herein incorporated by reference for all purposes. Furthermore, the dimensions described above are exemplary and may vary depending on the applicable groundrule.

After the fabrication of the trench, a single crystalline material is formed in the depression 175. By filling the trench with a single crystalline material, high performance devices such as access transistors can be fabricated on top of the trench. In accordance with the invention, the single crystalline material is formed using conventional chemical vapor deposition (CVD), also referred to as silicon vapor-phase epitaxial (epi) growth, as described in Sherman, *Chemical Vapor Deposition For Microelectronic Principle, Technology and Application*, Noyes Publication (1987), and Runyan et al., *Semiconductor Integrated Circuits Processing Technology*) Addison-Westley (1990), which are herein incorporated by reference for all purposes. The single crystalline layer is referred to as the epi layer. Epi growth techniques rely on the crystalline structure of the material on which the epi layer is to be grown to act as a seed crystal for the epi layer. As such, the epi layer typically assumes a structure similar to that of the material on which it is grown.

In general, epi growth is performed in a reactor comprising a quartz reaction chamber with a susceptor. The susceptor supports the substrate to facilitate a more uniform thermal environment. The formation of the epi layer involves chemical reactions of reactants being flowed into the chamber at high temperatures.

Various silicon sources or precursors, such as silicon tetrachloride ($SiCl_4$), dichlorosilane ($SiH_2Cl_2$), trichlorosilane ($SiHCl_3$), and silane ($SiH_4$), have been used for growing epi. The basic transport processes and reaction kinetics using the various precursors and reactants are described in, for example, Sherman, *Chemical Vapor Deposition For Microelectronic Principle, Technology and Application*, Noyes Publication (1987), which are herein incorporated by reference for all purposes.

In one embodiment, epi growth techniques which are "selective to silicon" are employed to form the single crystalline layer. "Selective to silicon" means that the epi layer forms only on silicon material. Since the nitride layer 115 typically surrounds the trench opening, the epi layer only grows in the trench area. Selective epi growth is performed at a temperature of between about 800 and 1150° C. The pressure in the reaction chamber is generally set between about 1 torr to about 1 atm. Hydrogen (H), SiH$_2$Cl$_2$, and Hydrogen Chloride (HCl) gases are pumped into the chamber to create a chemical reaction which forms the epi layer. The flow rate of the reactant gases are as follows: H is between about 1 and 200 s/m, and SiH$_2$Cl$_2$ and Hcl, which enhances the selecting of epi growth, are between about 100 and 1000 sccm each.

Alternatively, non-selective epi growth techniques are also useful. As known to those skilled in the art, selectivity depends on various factors such as, for example, HCl, reaction temperature, type of silicon precursor used, the type and the concentration of dopants. Thus, by varying these factors, selectivity can be enhanced, decreased or eliminated. Non-selective epi techniques grow epi over the pad nitride as well as silicon. Removal of the growth occurring over the nitride requires polishing and/or recess etching procedures.

Figure 2A:
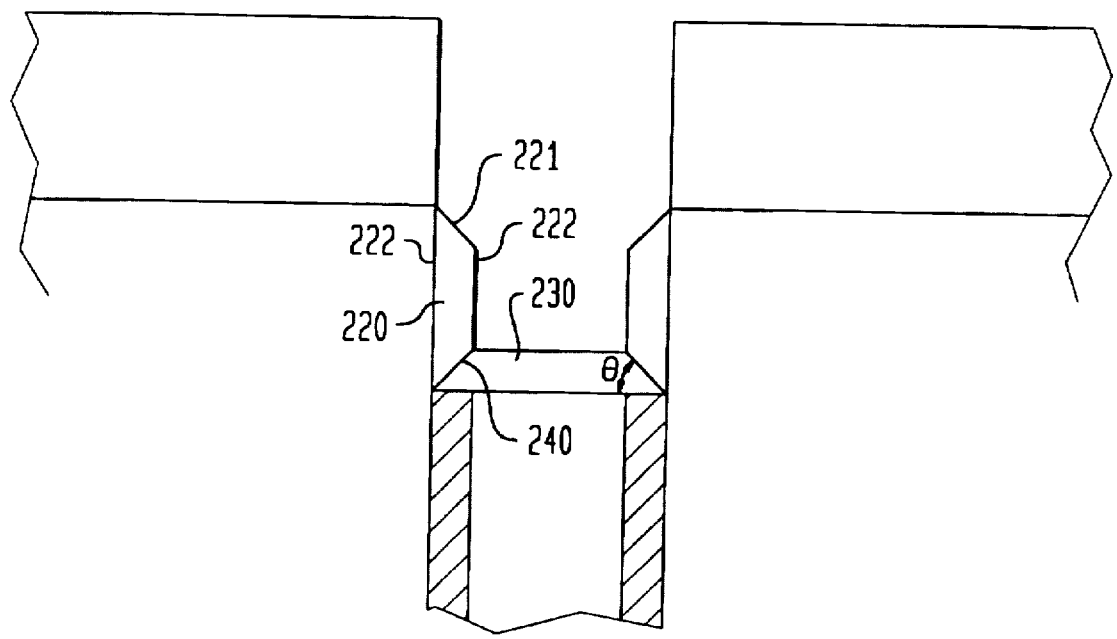
FIGS. 2A–E show different formation stages of the epitaxial silicon layer over the trench.
Figure 2B:
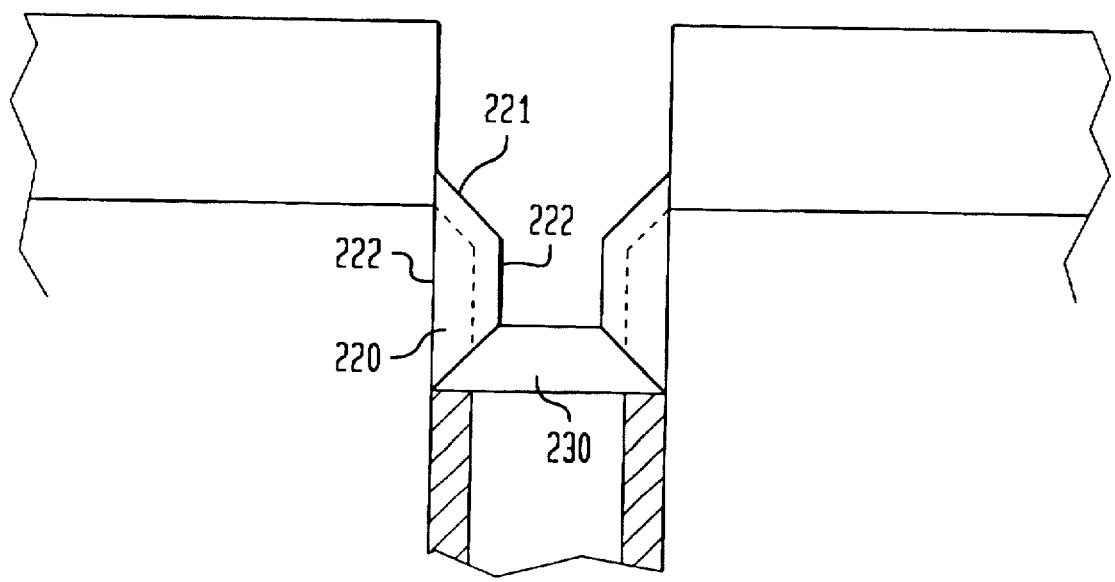

FIGS. 2A–2E show different stages of epi growth by selective epi techniques over time. The initial growth of the epi layer is shown in FIG. 2A. Because a selective epi technique is employed, growth occurs from the silicon sidewalls and the top of the poly in the trench. The growth 220 from the silicon sidewalls takes on a single crystalline structure. This single crystalline epi layer starts growing with <111> facets 221 and (110) and (100) top planes 222 from the trench sidewalls. With respect to the layer 230 growing from the top of the trench, it assumes a polycrystalline structure. As the epi and poly layers grow, they begin to merge and form an angle θ at the epi-poly interface 240, resulting in a cone shaped poly layer. The angle θ of the interface is determined by a <111> crystal plane, which is about 54° from the wafer surface. FIG. 2B shows the epi and poly layers as the growth process continues. The dotted lines indicate the growth of the layers at previous stage(s).

Figure 2C:
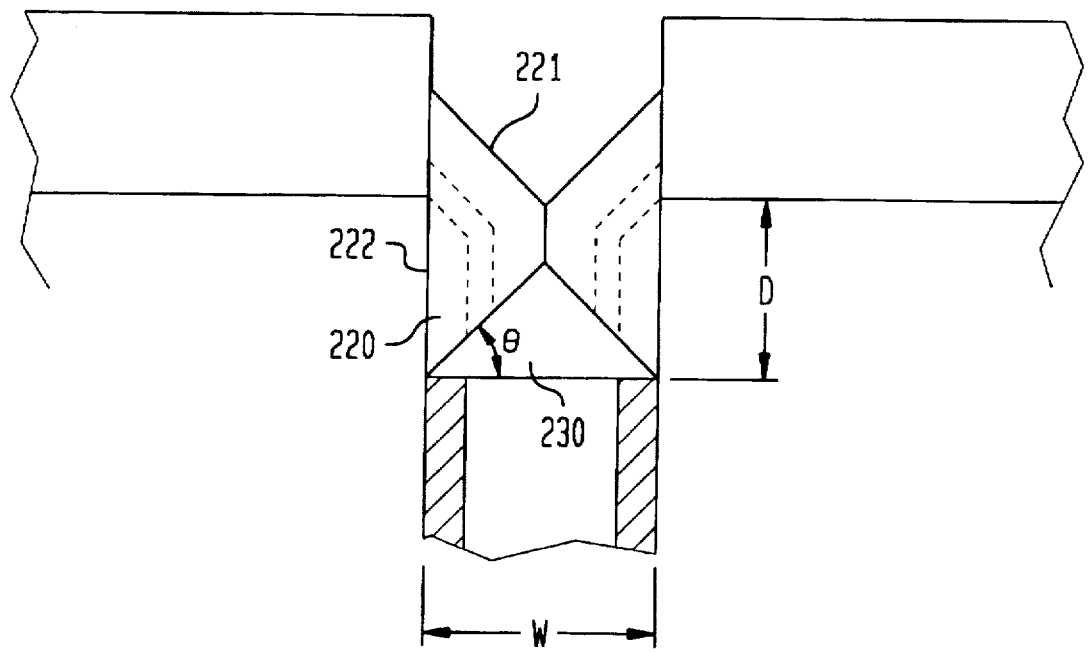

In FIG. 2C, the epi fronts from the trench sidewalls merge, forming a single crystalline layer on top of the poly cone 230. As discussed above, the poly growth is cone shaped because the epi-poly interface is formed at an angle from the trench sidewalls. The merging of the epi fronts is important to the successful formation of a single crystalline layer capping the poly filled trench. For instance, if the poly front squeezes in between the epi fronts and prevents their merger, then a single crystalline layer cannot be formed. Thus, the depth of the recess should be sufficient to effectively cause the epi fronts to merge. In one embodiment, the depth D of the recessed area to be filled should be at least (W/2)tan θ, where W is the diameter of the recessed area (in the case where the trench is not circular or square, W is the diameter of the widest portion of the trench) and θ is the angle that the poly-epi interface forms with the wafer surface.

Figure 2D:
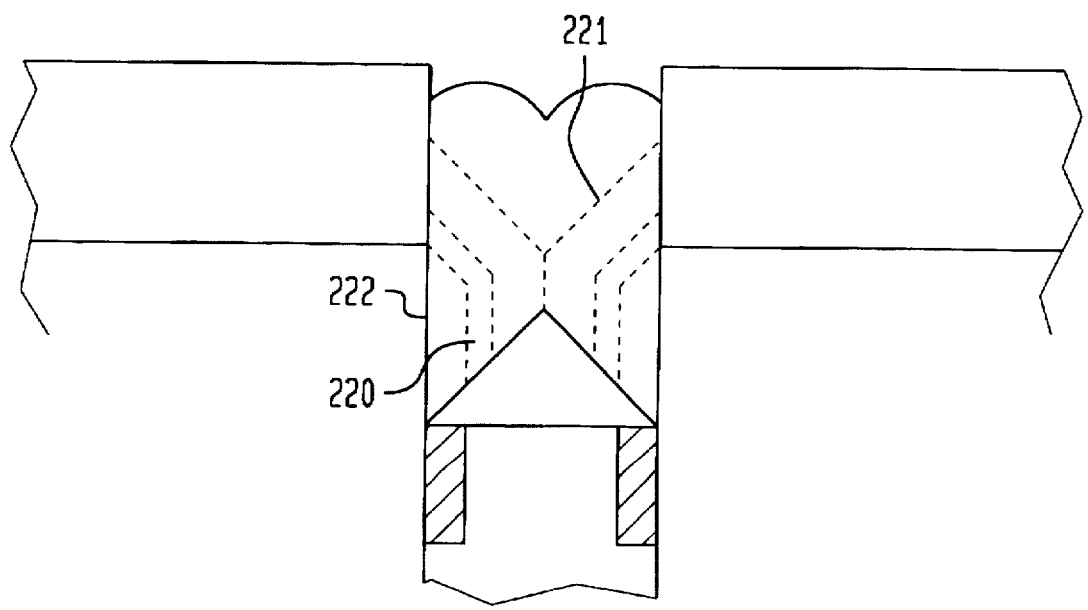
Figure 2E:
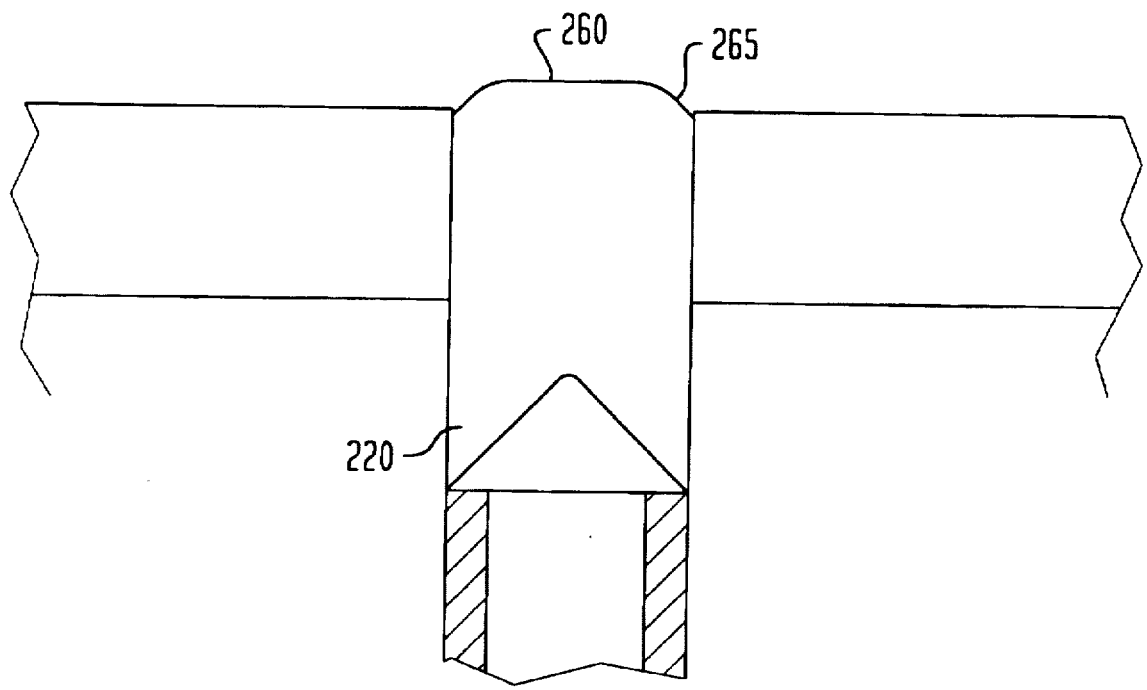

Referring to FIG. 2D, the growth process after the epi fronts have merged is shown. As shown, the epi growth at this stage is in a vertical direction from the <111> faceted surface 221. At the trench sidewalls, the epi layer tends to grow with <311> facets 265, as depicted in FIG. 2E. This faceted growth, along with the incubation effects of the epi surface, cause the epi to grow slower at the trench sidewalls than at the center, resulting in a convex epi surface 260. The top of the epi surface can be polished to provide a level <100> surface on which devices can be fabricated.

Figure 2F:
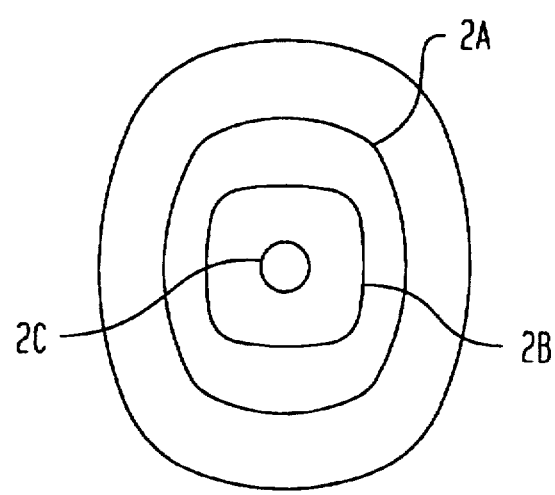
FIG. 2F shows a top view of different formation stages of the epitaxial silicon 3 layer.

FIG. 2F depicts a top view of the various stages of the epi growth in the trench. As shown, growth stages 2A–2C correspond to the growth stages depicted in FIGS. 2A–2C, respectively.

Figure 3:
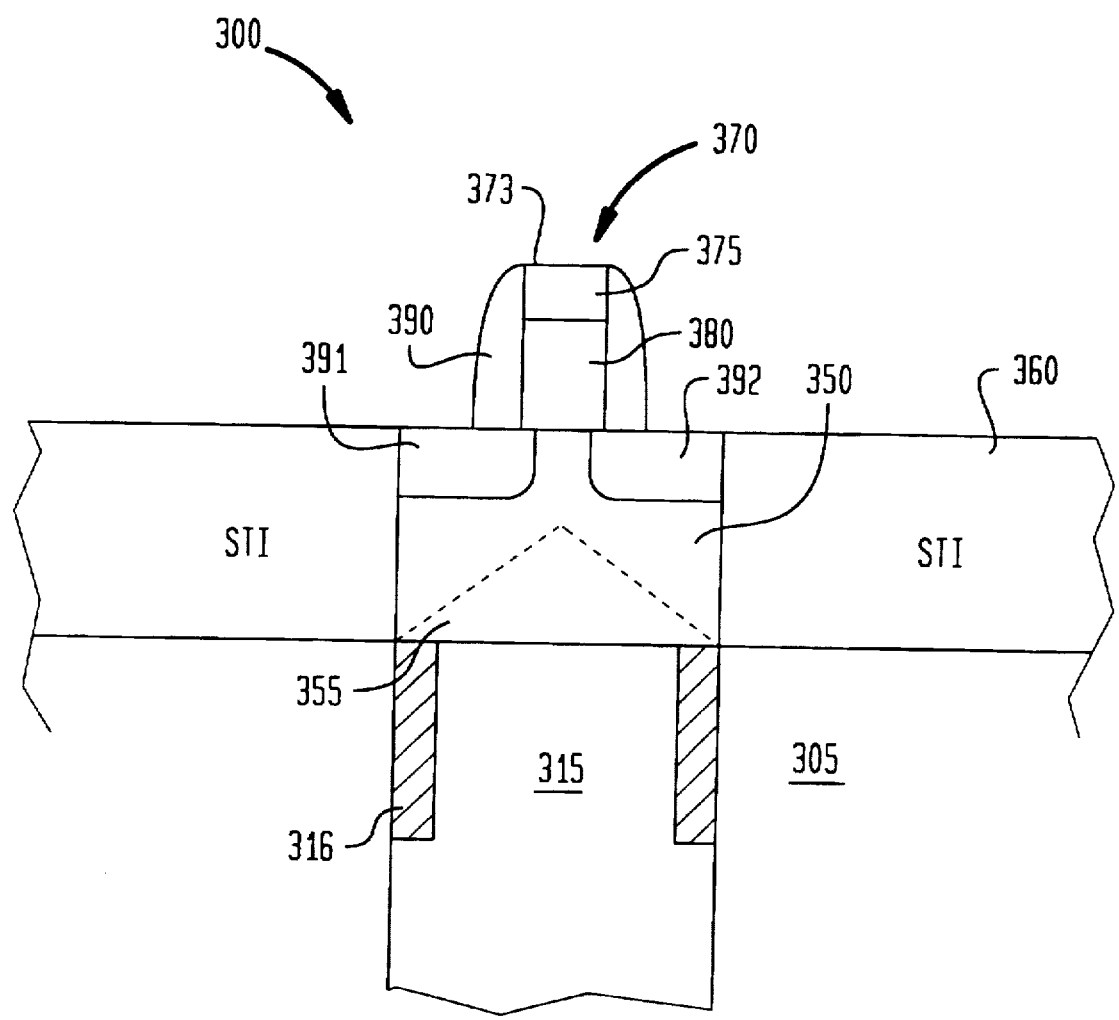
FIG. 3 shows an exemplary embodiment of a three-dimensional structure.

FIG. 3 is an illustrative embodiment of a three-dimensional structure 300. Such structure, for example, is implemented in a DRAM array. As shown, the structure includes a trench capacitor 315 formed in a semiconductor substrate 305, as described in FIG. 1. A collar oxide 316 surrounds the trench sidewalls. Above the trench capacitor, 315, an epi layer 350 is formed by epi growth techniques described in FIGS. 2a–2F. The dotted line 355 depicts the cone shaped poly-epi interface created by the epi growth process.

A transistor 370 is fabricated on the surface of the epi layer. The transistor has been simplified for purposes of illustration. The transistor is fabricated by conventional techniques, such as those described in Sze, VLSI Technology, which is already incorporated by reference for all purposes. The transistor includes a gate region 373, which typically comprises a poly layer 380 capped with a nitride layer 375 and gate sidewalls spacers 390. To reduce the sheet resistance of the gate region, a composite gate stack comprising silicides is used. Silicides, such as molybdenum silicide (MoSi$_x$), silicide tantalum (TaSi$_x$), tungsten silicide (WSi$_x$), titanium silicide (TiSi$_x$), or cobalt silicide (CoSi$_x$), are useful to form the composite gate stack. Alternatively, aluminum or refractory metals, such tungsten and molybdenum, can be used alone or in combination with silicides or poly. Additionally, the transistor includes drain 391 and source 392 regions formed by implantation of dopants. Shallow trench isolation regions 360 are formed to isolate the DRAM structure 300 from other DRAM structures of the DRAM array.

Figure 4A:
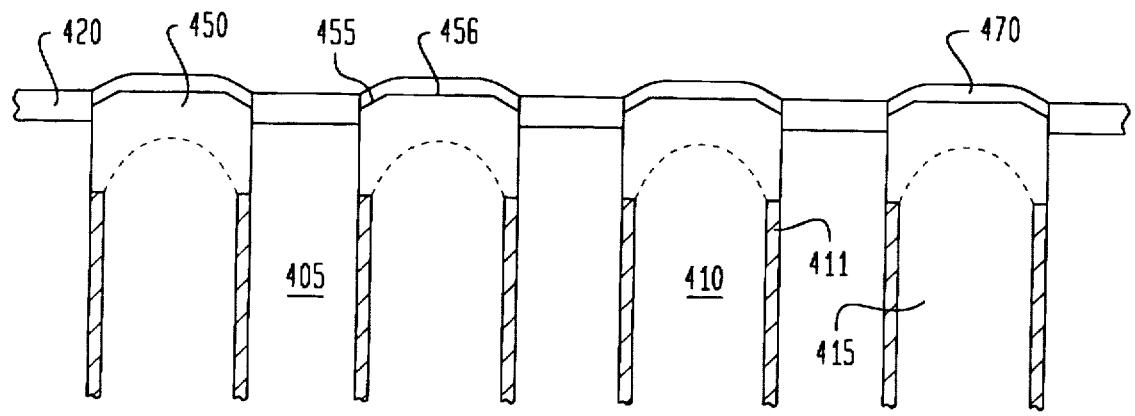
FIGS. 4—13 show various stages of forming a three-dimensional DRAM array with sub-groundrule features.

FIGS. 4A and B–10A and B show the various stages of forming a three dimensional DRAM array incorporating the three-dimensional structure of FIG. 3. FIGS. 4A–10A depict the side view and FIGS. 4B–10B depict the corresponding top view of the array. Common structures within these FIGS. 4–10 are denoted by common numbers. Although the DRAM array, as shown, utilizes an open-bitline architecture, those skilled in the art will appreciate that other bitline architectures, such as a folded-bitline or variations thereof, are applicable.

Figure 4B:
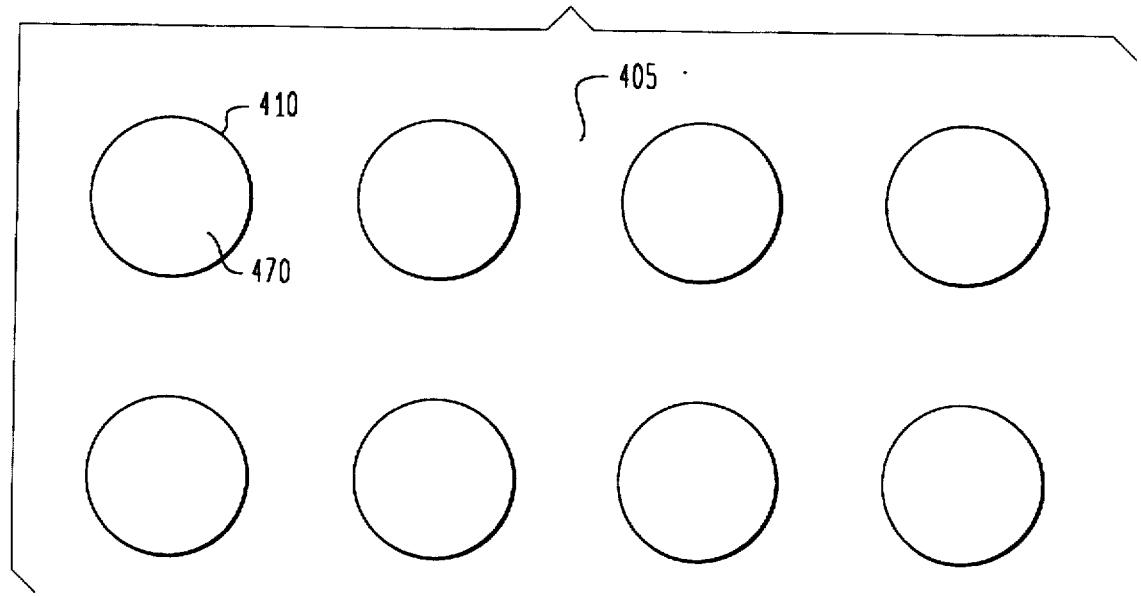

Referring to FIGS. 4A–B, a substrate 405 with a pad nitride layer 420 is shown. The substrate includes an array of conventional trench capacitors 410 etched therein. For purposes of illustration, the top portion of the trenches are shown. As shown, the trench capacitors are filled with poly 415 and surrounded by an oxide collar 411. The poly-filled trenches are then recessed from the surface of the substrate. An epi layer 450 is then grown in the recessed areas to provide a single crystalline surface above the trenches. The top of the epi layer includes <311> facets 455 and <100> planar surfaces 456. The epi layer is then oxidized, creating an oxide layer 470 having a thickness of about 20–30 nm.

Figure 5A:
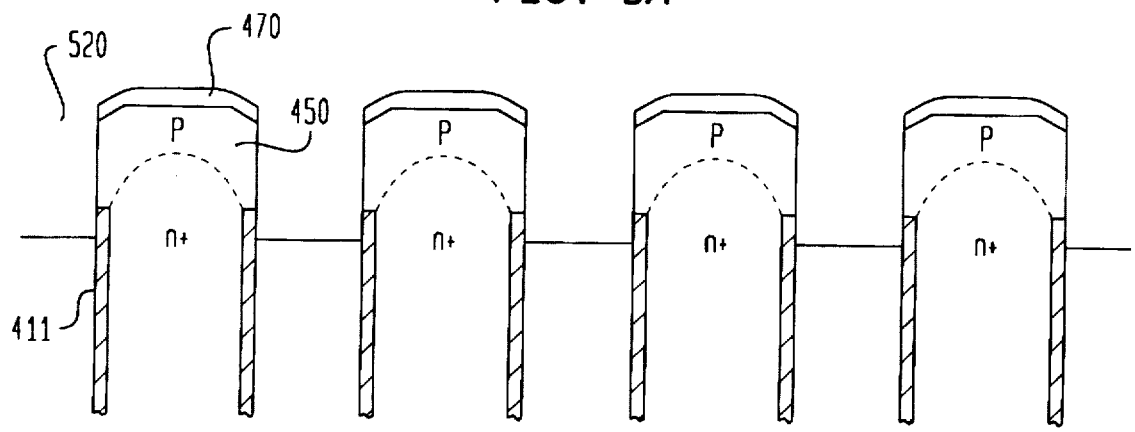
Figure 5B:
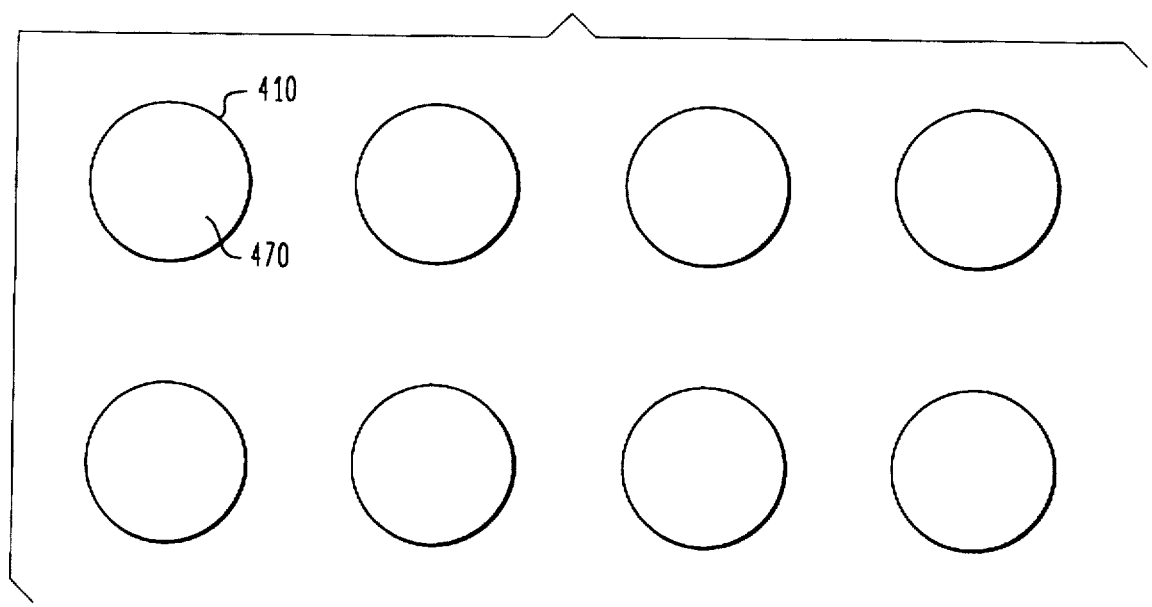

In FIG. 5A, the formation of shallow trenches 520 is shown. To form the shallow trenches, the pad nitride layer 420 (from FIG. 4A) is removed selective to oxide, enabling the removal of the pad nitride layer without removing the oxide 470 and epi layers 450. The silicon substrate is then recessed to a depth slightly below the collar oxide 411, which is about 200–300 nm to form the shallow trenches. A conventional reactive ion etch (RIE) technique is employed to recess the silicon. In order to avoid removal of the epi layer, the RIE is selective to oxide using conventional HCl chemistry. The selectivity to oxide of the RIE should be sufficient to remove the epi layer without removing the oxide layer. Typically the selectivity to oxide is about 100 or greater.

Figure 6A:
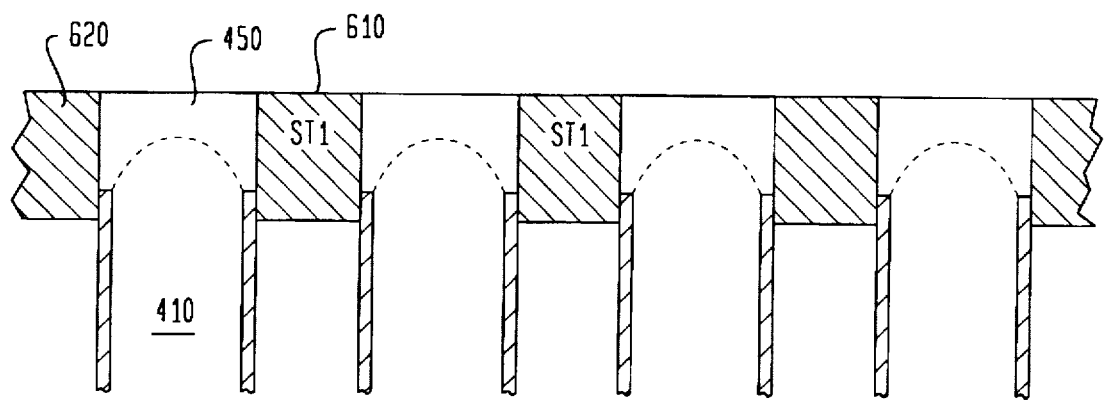
Figure 6B:
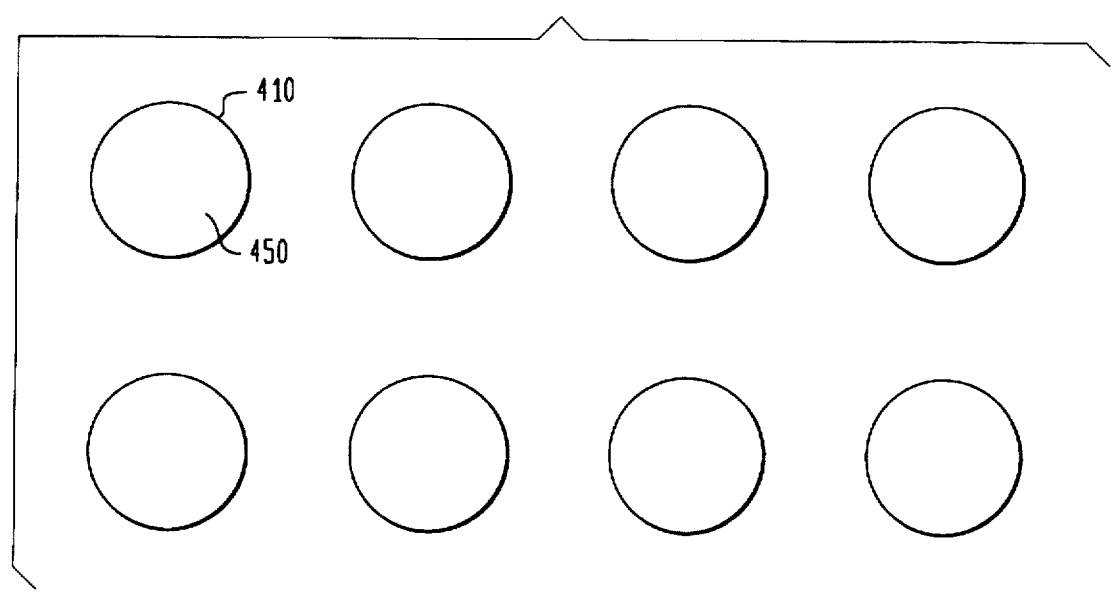

As shown in FIG. 6A, the shallow trenches are then filed with oxide 620, such as TEOS, by CVD. The surface of the substrate is then planarized to remove the nitride layer. The planarization process also removes the <311> facets of the of the epi layer, thus providing a planarized surface 610.

Figure 7A:
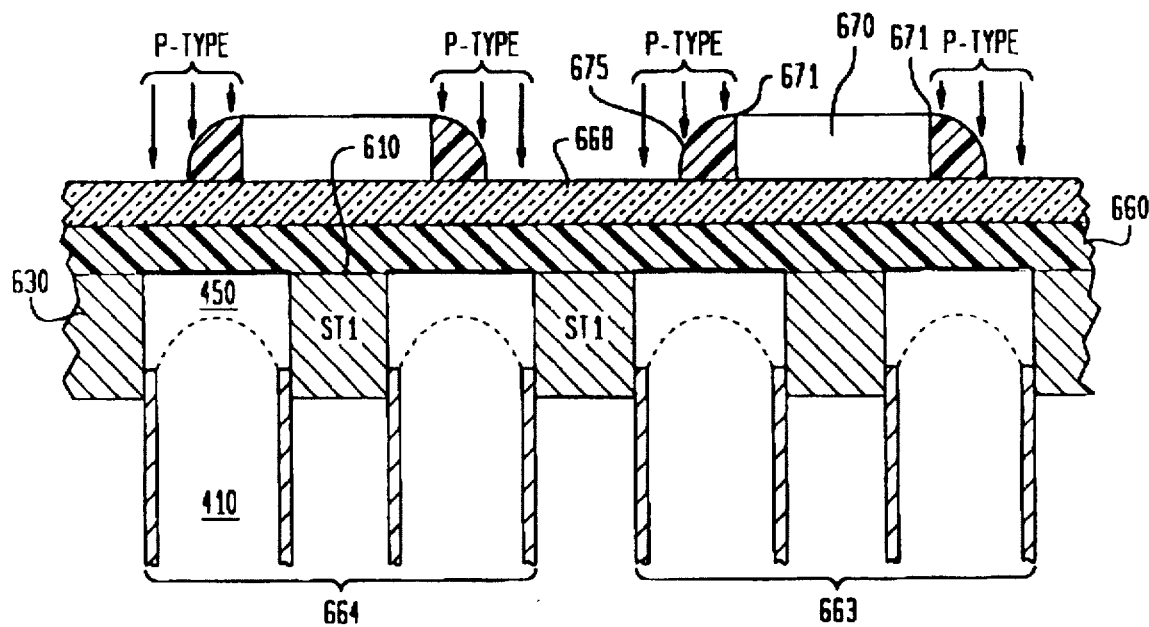

At this stage, transistors with sub-groundrule gates are formed above the epi layer portion of the substrates. The formation of sub-groundrule gates enables the width of the trench capacitors to be maintained at minimum feature size. FIGS. 7A and B–9A and B show the process of forming sub-groundrule gates. As shown, the sub-groundrule gates are formed using mandrel and spacer techniques.

Figure 7B:
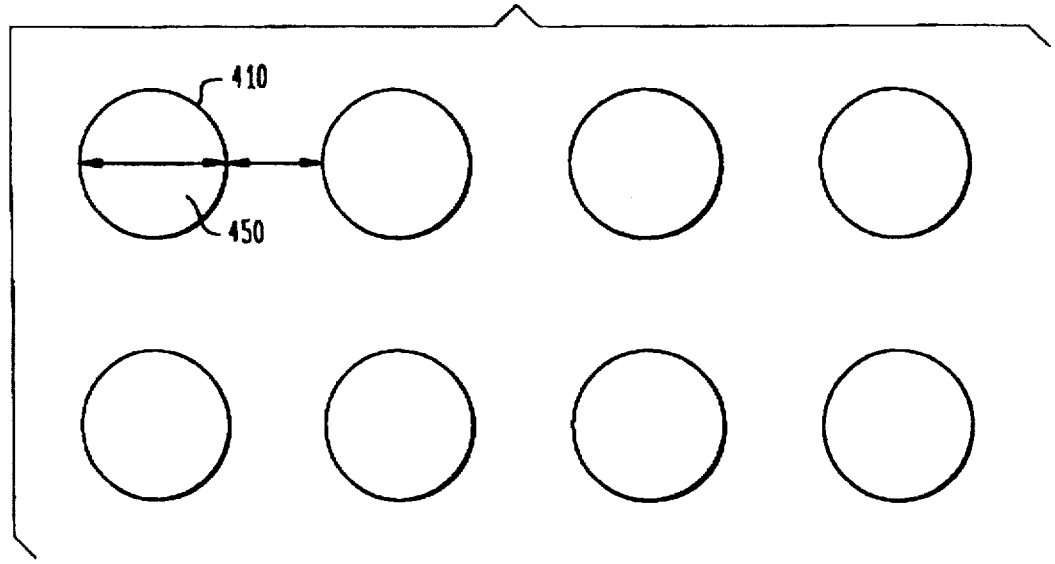

Referring to FIGS. 7A–B, a sacrificial oxide layer (not shown) is formed on the substrate by, for example, thermal oxidation. Dopant atoms are implanted through the sacrificial oxide layer to tailor the doping profile in the epi layer to obtain the desired threshold voltage and punch through immunity. As shown, the epi is implanted with a P-type dopant. After the epi has been implanted with the desired dopant profile, the sacrificial oxide layer is removed and a gate oxide layer 630 is formed over the epi.

To form the gate of the access transistors which serves as the wordlines of the array, a wordline layer 660 is formed over the surface of the substrate. The wordline layer comprises poly. Illustratively, the poly layer is doped with $N^+$ dopants. $N^+$ dopants are preferred as they produce a device with desirable short channel characteristics. In some applications, a silicide layer is form above the poly layer to produce a composite gate stack. Various silicides, including silicide molybdenum ($MoSi_x$), tantalum silicide ($TaSi_x$), tungsten silicide ($WSi_x$), titanium silicide ($TiSi_x$), or cobalt silicide ($CoSi_x$), are used to form the silicide layer Alternatively, aluminum or refractory metals, such as tungsten and molybdenum, are used alone or in combination with silicides or poly. Composite gates are desirable as their use reduces the sheet resistance of the gate region, thereby decreasing the R-C delay of signals that are routed along it. Typically, the poly layer about 100 nm thick and the silicide layer is about 50 nm thick. A nitride layer 665, which serves as an etch stop for subsequent process steps is deposited over the wordline layer by, for example, low pressure chemical vapor deposition (LPCVD).

A poly layer is formed over the nitride layer 655. A mask patterns the poly layer to define regions where mandrels 670 are to be located. The non-mandrel regions are removed using conventional etching techniques, forming alternating lines or mandrels and spaces. The nitride layer 665 serves as an etch stop. As a result, the spaces comprises nitride and the mandrels comprises poly. As shown, each line covers a portion of the epi layer above a pair of trenches 663 and 664. The edges of the mandrel are used to define one edge of the wordline. The portion of the mandrel overlapping the epi should be sufficient for forming the source or drain of the access transistor within the epi layer. Typically, edges 671 of the mandrels are nominally located a distance from the center of the epi which is equal to about half the width of the wordline, i.e., half the width of the gate of the access transistor. For example, the edges of the mandrels are positioned about 100 nm from the center of the trenches to form 200 nm wide wordlines.

After patterning the mandrels, a layer of oxide is formed over the surface of the substrate. The oxide layer is formed by, for example, CVD. The oxide layer is sufficiently thick to form oxide spacers 675 on the side of the mandrels. Typically, the oxide layer is about 100–250 nm thick. A portion of the oxide layer is removed using, for example, reactive ion etch (RIE) techniques to form spacers 675. The width of the spacers defines the width of the wordlines.

Since the width of areas 680 between the spacers and the mandrels are greater than minimum feature size, the spacers can be made smaller than groundrule. Typically, the width of the spacer, for minimum groundrule of about 0.25 μm, is about 50–200 nm. Of course, the width of the spacer would be scaled up or down proportionally to correspond to an increase or decrease in groundrule.

Figure 8A:
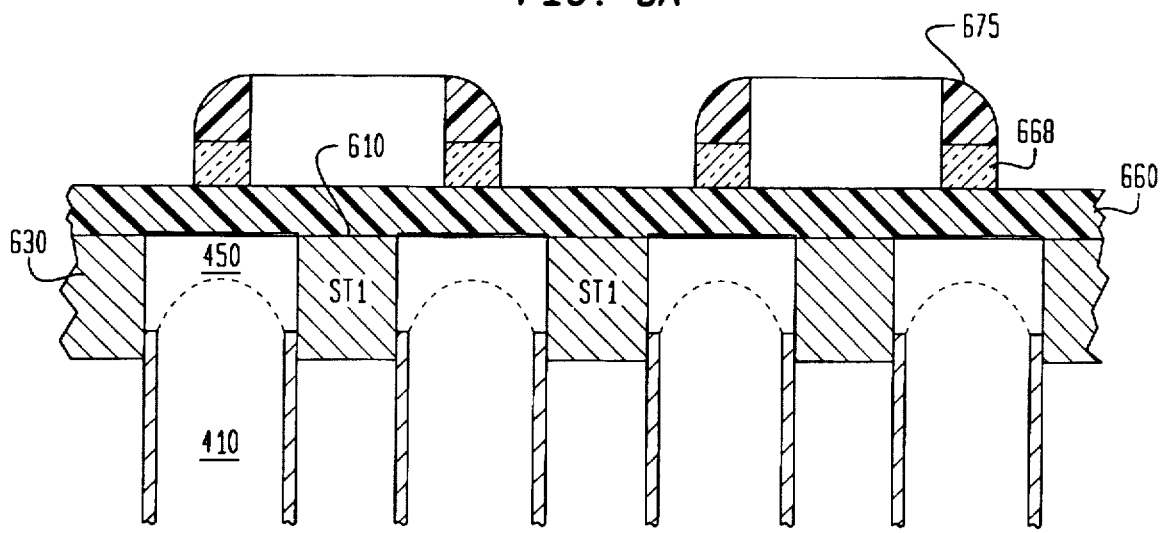
Figure 8B:
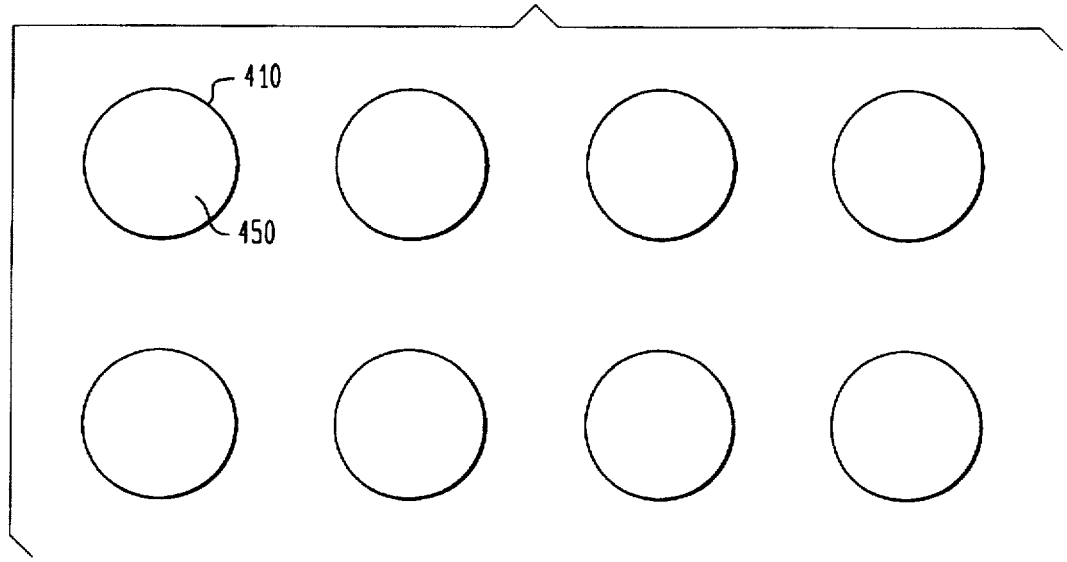

Referring to FIGS. 8A–B, removal of the mandrels is shown. The mandrels are removed by performing an RIE technique that is selective to oxide and nitride. Such techniques are described in Ghandhi, *VLSI Fabrication Principles Silicon and Galium Arsenide*, 2nd Ed., Wiley (1994), which is herein incorporated by reference for all purposes. The result of the RIE is that the mandrels are removed while leaving the TEOS spacers 675 in place. An anisotropic etch which is selective to oxide is then performed, removing the exposed nitride (indicated by the dotted line 666) while leaving nitride blocks 668 under the oxide spacers 675.

Figure 9A:
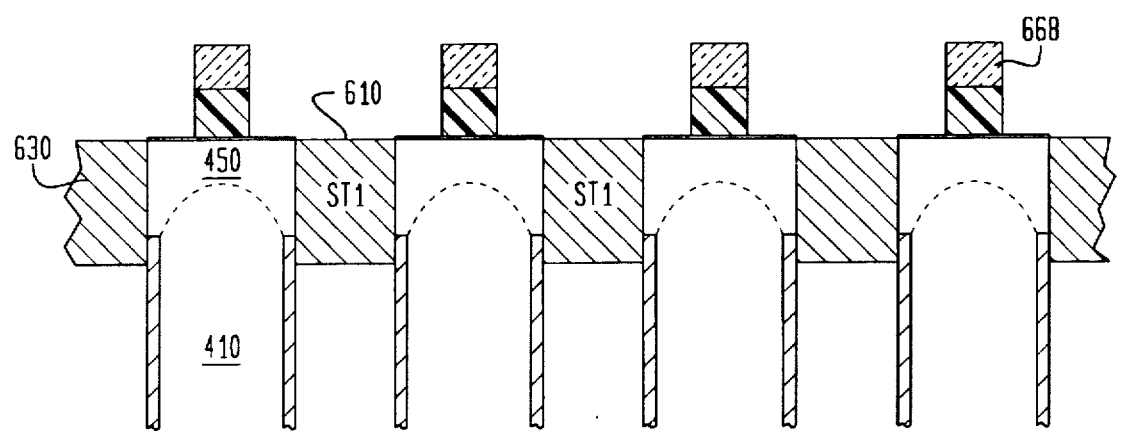
Figure 9B:
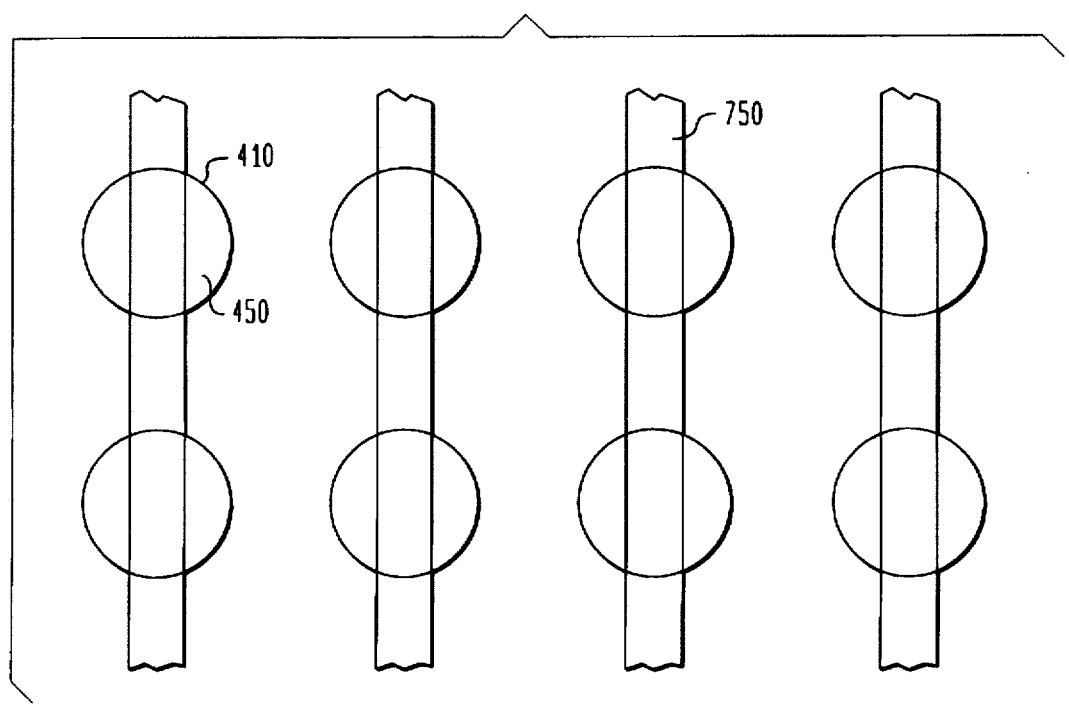

Referring to FIGS. 9A–B, a RIE that is selective to nitride and poly is performed to remove the spacers, leaving nitride blocks 668 on top of wordline layer (indicated by dotted line 690). The nitride blocks act as a mask, defining the wordlines 750. Alternatively, the spacers are removed by conventional chemical mechanical polishing (CMP) techniques. CMP techniques are described in Ghandhi, *VLSI Fabrication Principles Silicon and Galium Arsenide*, 2nd Ed., Wiley (1994), which is already herein incorporated by reference for all purposes. Since the nitride blocks are physically much harder than the spacers, they act as the CMP stop. A RIE selective to nitride and oxide is performed. This RIE process removes the portions of the wordline layer that are not protected by the nitride blocks. As a result, gate conductors having a nitride cap are formed over the trenches. The gate conductors 750 serve as the wordlines of DRAM array.

Figure 10A:
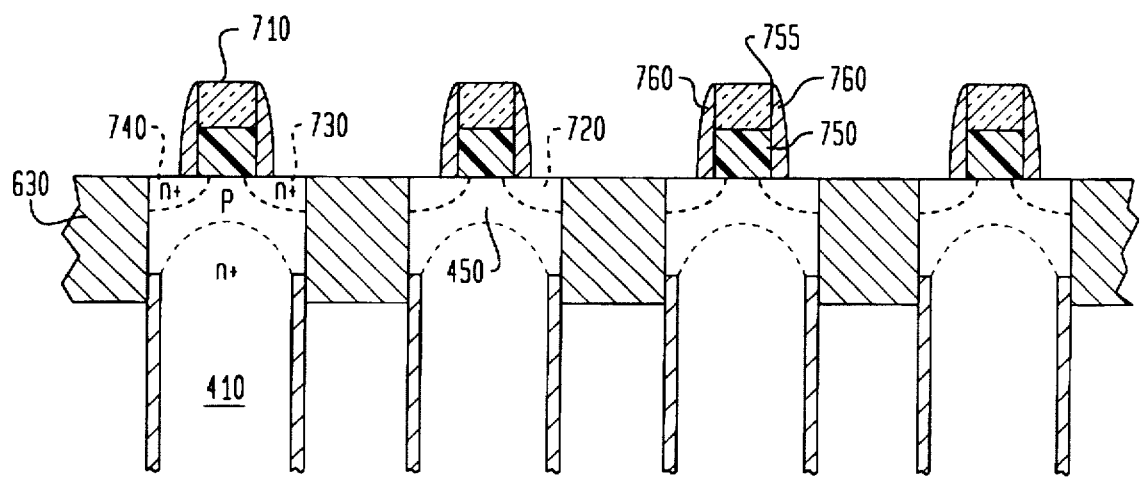
Figure 10B:
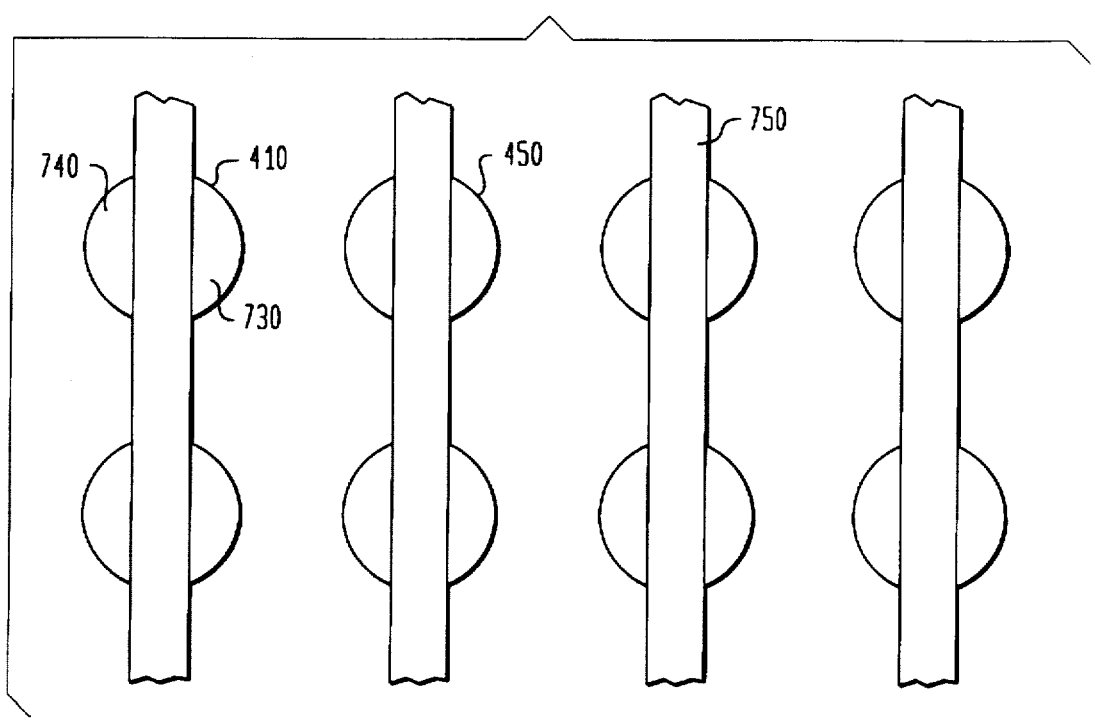

FIGS. 10A–B show insulating sidewall spacers 760 formed on the side of the gate conductors. The spacers comprises, for example, nitride. Ion implantation is performed to form source 730 and drain 740 regions. As shown, the drain and source regions are implanted with N-type dopant atoms. The drain and source regions are the bitline and node connections of the DRAM array. Spacers and the source and drain regions are formed using conventional techniques. Such techniques, for example, are described in S. M. Sze, *VLSI Technology*, 2nd ed., New York, McGraw-Hill, 1988, which is already incorporated by reference for all purposes.

Figure 11A:
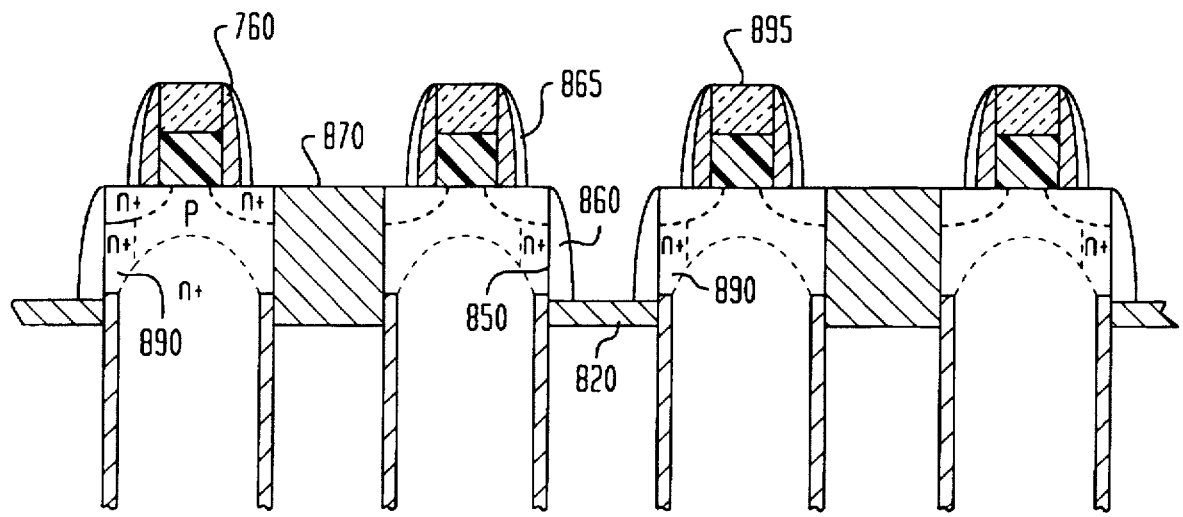
Figure 11B:
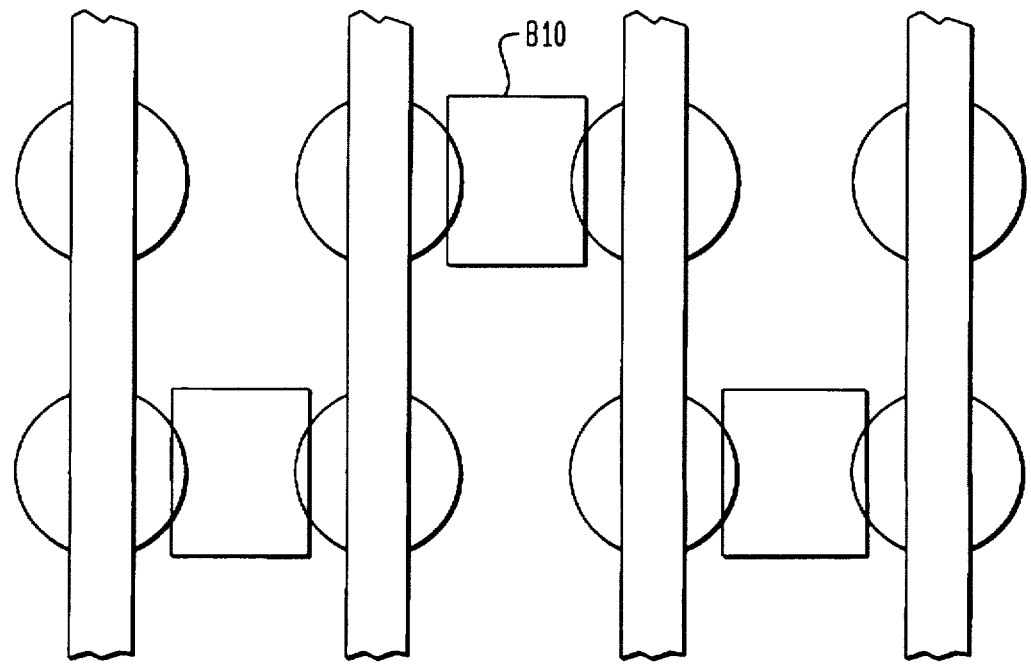

Referring to FIGS. 11A–B, a strap mask is used to define strap mask regions 810 between adjacent devices. Conventional RIE is performed to remove the TEOS in the strap mask regions 810. An isotropic chemical dry etch (CDE) should subsequently be performed to assure that the epi sidewalls are exposed. The CDE exposes the epi sidewalls 850, with a thin layer 820 of TEOS remaining. The thin layer is of a thickness sufficient to serve as a diffusion barrier. Typically, the thickness of the thin layer is about 50 nm. Areas 870 between adjacent bitlines are protected by the strap mask and do not have any of the TEOS therein removed. A layer of N-type doped glass, such as arsenic doped glass (ASG) or phosphorous doped glass (PSG), is formed over the surface of the array and RIE is performed to form spacers 860 on the exposed epi sidewalls 850 and spacers 865 over the gate nitride spacers 760. Typically, DRAM array with N-type channel transistors employs N-type and P-type channel transistors for peripheral support devices such as decoders. To protect the P diffusions in the drain and source regions of the P-type channel transistors, the N-type doped spacers on these P-type channel transistors are removed. Removal of the N-type doped spacers from the P-type channel transistors is achieved by employing a protective layer and an additional mask.

An anneal is performed to drive the N-type dopants from the doped glass into the epi sidewalls, forming a N⁺ layer 890. Typically, the conditions of the anneal are as follows: about 900° C. for 10 minutes in an inert ambient. However, the anneal conditions are not critical and are flexible to effectively form the N⁺ layer 890 without seriously affecting the doping in the epi layer. For example, rapid thermal annealing (RTA) techniques are also useful to form the N⁺ layer without disturbing the epi doping. The N⁺ layer 890 provides continuity between the node N⁺ diffusion and the N⁺ outdiffusion from the poly in the trench. The N⁺ layer is referred to as a buried strap. Diffusion from N⁺ doped layer 865 on the gate conductors augments the source and drain doping, thus reducing diffusion resistance. A layer of TEOS is then deposited over the array and planarized to the top 895 of the gates.

Figure 11C:
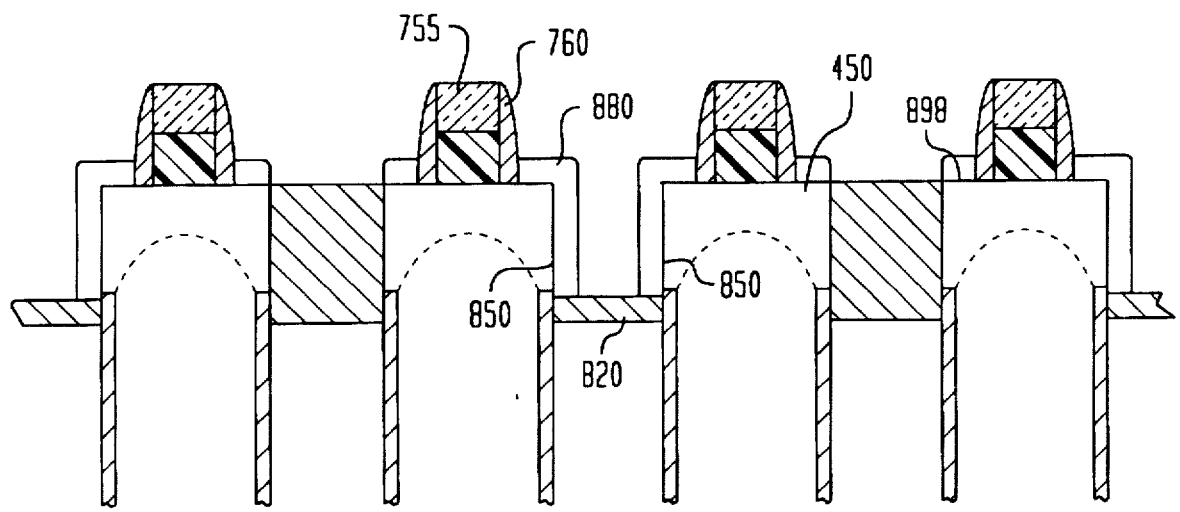

FIG. 11C shows an alternative technique for forming connections between the N⁺ node diffusion and the N⁺ outdiffusion from the poly in the trench. As shown, straps 880 are formed by selective epi growth techniques on the sidewalls 850. The straps are doped with N-type dopants during epi growth. To focus the epi formation on the epi sidewalls 850, selective epi technique is employed. Illustratively, spacers 760 and layers 820 comprise TEOS and gate cap 755 comprises nitride. As such, the epi growth is selective to the epi sidewalls and not to TEOS and nitride. Such selectivity is achieved using epi growth techniques which are similar to those employed from growing the epi layer 450. Although epi growth also occurs on the exposed portions 898 and 899 of the drain and source regions, such epi growth does not adversely affect device functions.

Formation of the strap using epi techniques advantageously eliminates lithographic and etching steps needed to remove the N⁺ doped glass from the P-type channel peripheral devices. Also, epi straps do not need an anneal to complete the connection between the N⁺ node diffusion and the N⁺ outdiffusion from the poly in the trench. Elimination of the anneal lowers the overall thermal budget required to fabricate the device, which is desirable.

Figure 12A:
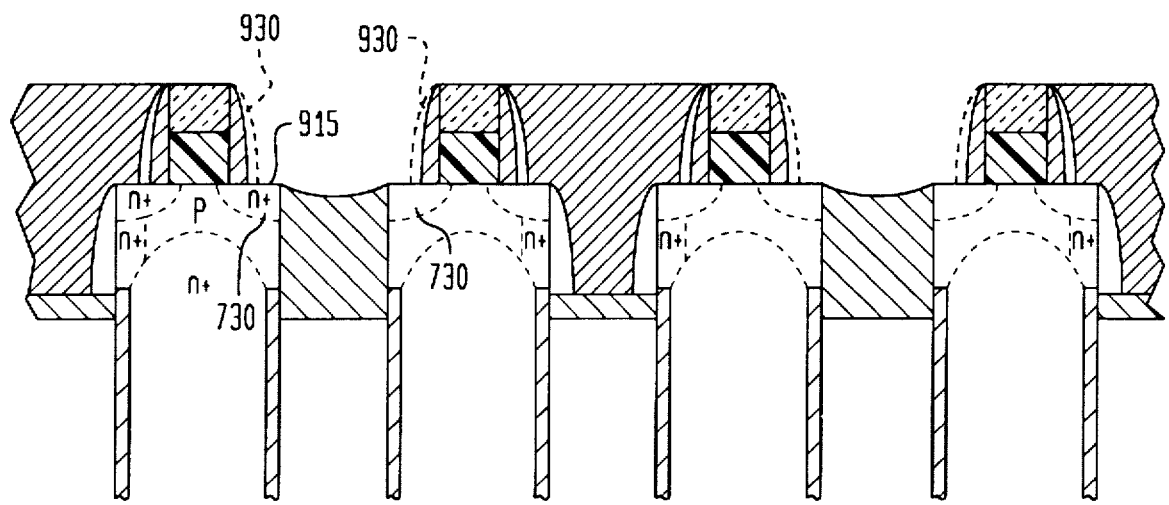
Figure 12B:
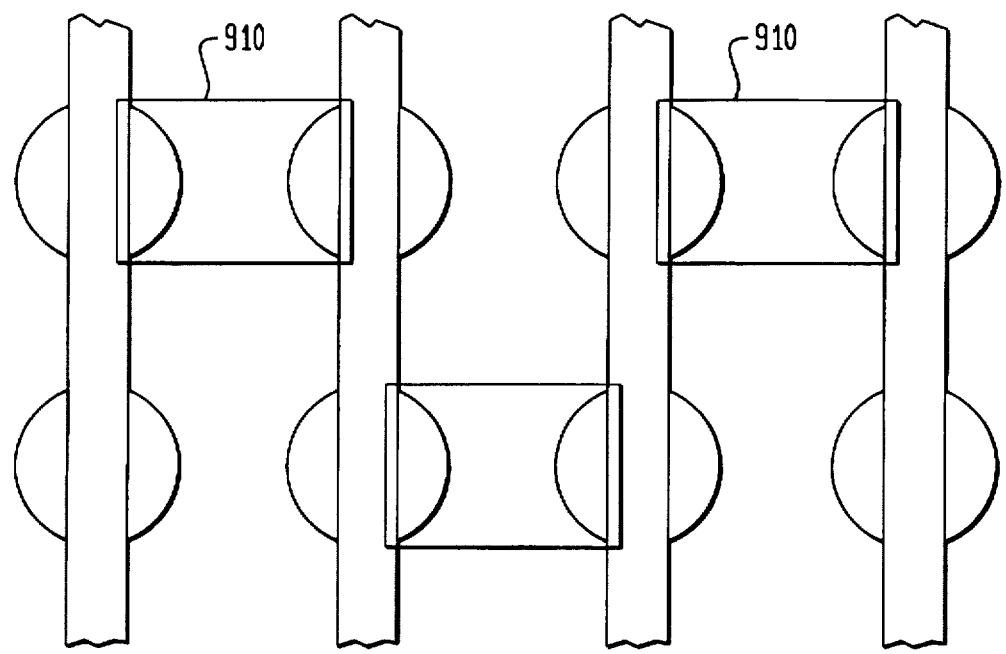

FIG. 12A-B show a mask used to define regions 910 between adjacent bitline diffusions. The TEOS in regions 910 is removed sufficiently to expose the top surface 915 of the silicon in these areas. To assure that the bitline diffusions are free of oxide, overetching is employed. Overetching causes small recessing of the TEOS fill between adjacent bitline diffusions 730. An isotropic CDE is used to remove the doped glass layer (depicted by dotted lines 930) from the nitride sidewall spacers, assuring adequate bitline contact areas. For embodiments utilizing epi straps, as shown in FIG. 11C, the CDE is not needed because doped glass is not used.

Figure 13A:
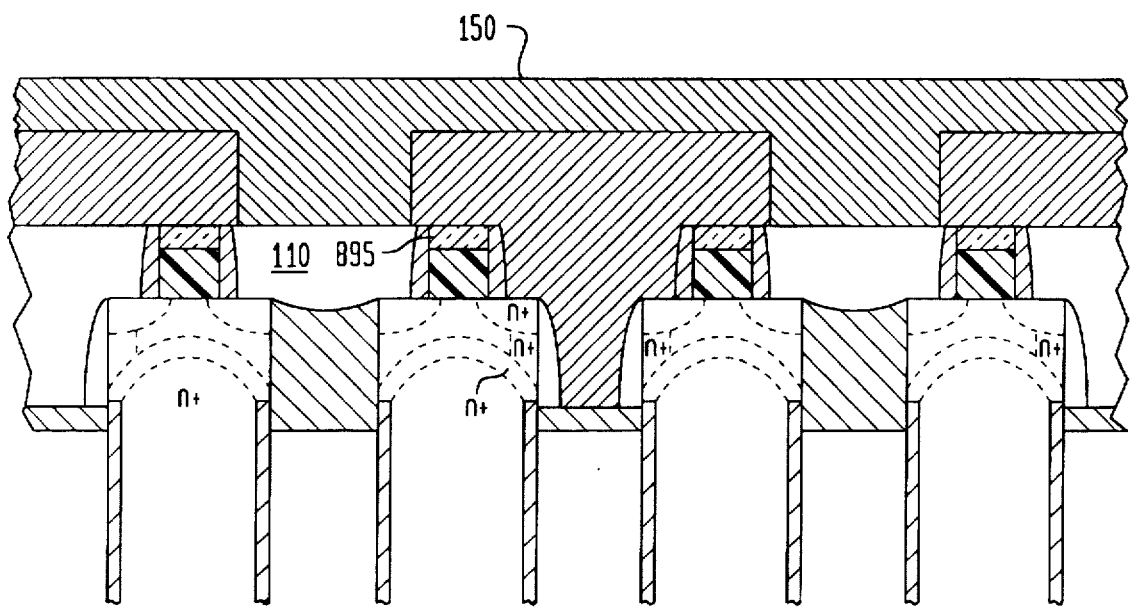
Figure 13B:
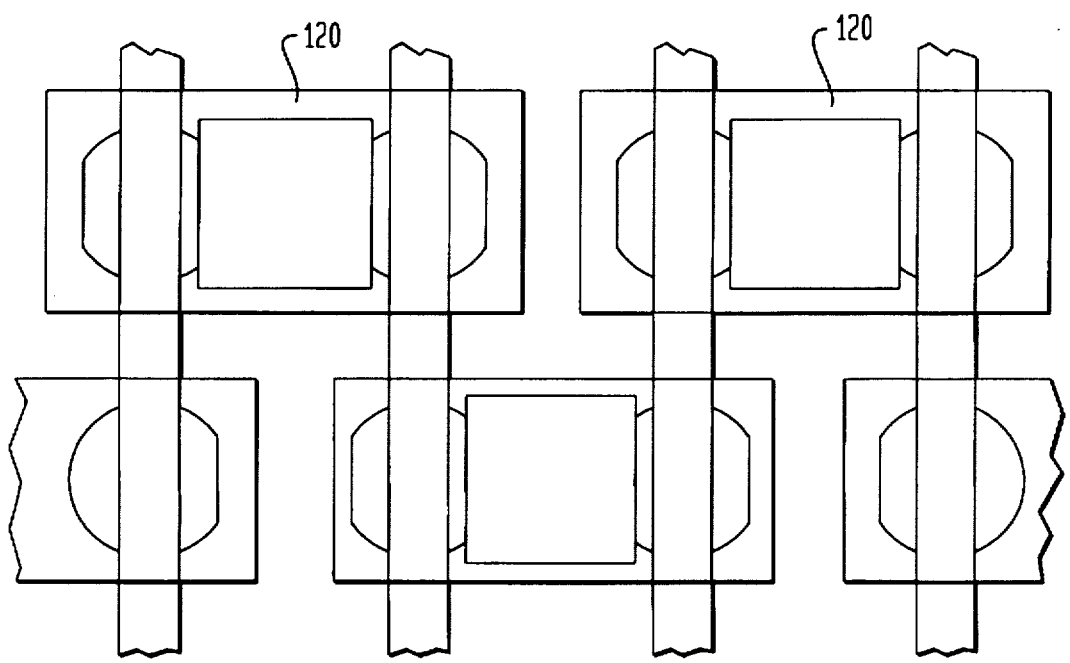

Referring to FIG. 13A-B, highly doped N⁺ poly layer is then formed on the surface. The poly layer is planarized to the top of the gates 895 to form bitline contact areas 110. A M0 dielectric such as TEOS is deposited by CVD and planarized, if necessary. Bitline contact openings 120 are defined in the M0 dielectric layer. The M0 dielectric layer at the bitline contact openings is recessed to expose the poly 110. A metal layer 150 is then deposited, filling the contact openings 120. The metal layer is then etched to form the bitline conductors.

The ability to locate devices spatially above the trenches allows more efficient three-dimensional design layouts, thereby increasing the density of devices for a given area. However, isolation between the devices at different layers may sometimes be compromised, particularly with low leakage (low power) applications (such as portable devices). For example, in the case of a DRAM cell having an access transistor fabricated on top of the epi layer above the trench, the bitline diffusion (i.e., the drain of the transistor) can "punch through" the epi layer, creating an electrical connection with the node diffusion. Punch through causes the stored charge to leak off the capacitor, adversely affecting the operability of the DRAM cell.

Figure 14:
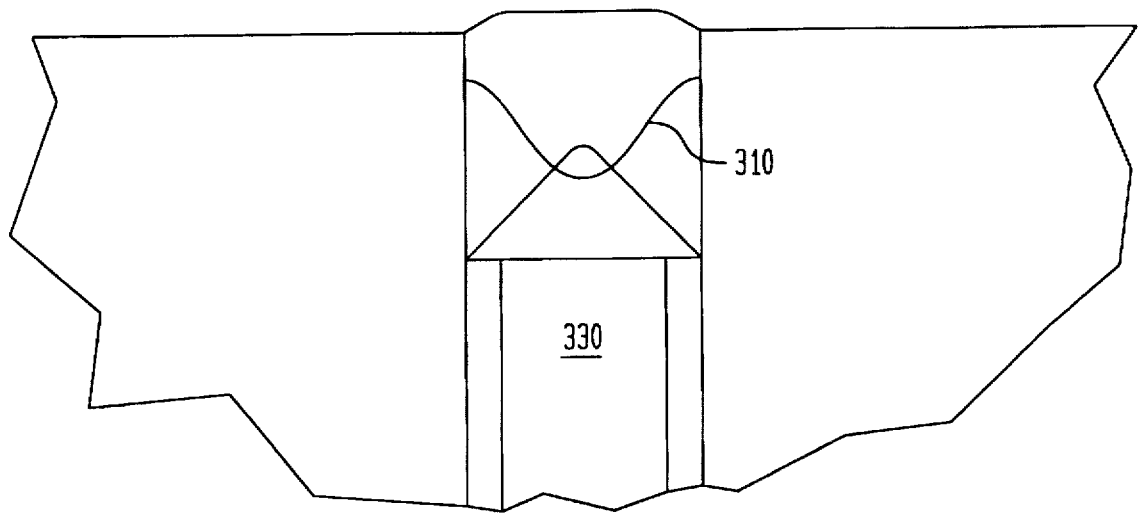
FIG. 14 shows a delta layer incorporated into the epitaxial silicon layer of FIGS. 2A–E.

FIG. 14 is a trench capacitor 300 having a delta doping layer 310 to ensure isolation between the N⁺ poly 330 in the trench and the bitline of a device fabricated thereon. The delta layer comprises dopant atoms having the same conductivity as the region above the storage node, i.e., the same as the epi region (i.e., P⁺) of the transistor. The delta layer produces a local increase in dopant concentration, which raises the electrical barrier and resistance to punch through between the storage node and the bitline diffusion.

As shown in FIG. 14, the trench poly (prior to epi growth) is doped with an N-type dopant, and the delta layer is doped with a P-type dopant. The concentration of the dopants should be sufficient to prevent punch through without causing current leakage from the trench capacitor. Additionally, the delta layer is isolated from the junction depletion regions.

The delta layer is formed in conjunction with the epi growth process. As shown, lightly doped epi growth commences. The epi layer is doped with, for example, B of about $1 \times 10^{17}$ to $1 \times 10^{18}$ cm$^{-3}$. After undergoing partial formation of the epi layer, higher concentration of B is injected into the chamber to form the delta layer. The concentration of B used to form the delta layer is between about $3 \times 10^{17}$–$2 \times 10^{18}$. Concentration below about $3 \times 10^{17}$ is ineffective to prevent punch through while concentration above $2 \times 10^{18}$ tends to cause leakage currents. To avoid encroachment of the delta layer on the N⁺ dopants from the trench, the thickness of the poly growth should be about 100 nm. After the layer is formed, injection of B is terminated and lightly doped epi growth continues until the trench is capped. The low temperature processes, which typically follow, limit the diffusion of the delta doping layer.

EXAMPLES

Example 1

In an experiment, a conventional trench having a diameter of 300 nm and depth of 8 μm was formed in the surface of a <100> wafer. The wafer is doped with about $10^{16}$ cm$^{-3}$ of B. The top of the trench was recessed about 170 nm below the pad nitride-silicon interface. The wafer then underwent selective epitaxial growth in a reactor.

The wafer was prebaked in the reactor at about 925° C. for about 75 sec at a pressure of about 80 T in a H ambient. The prebake removes any native oxide at the interfaces prior to the epi growth. After the prebake, selective epi growth was performed in the reactor by reacting SiH₂Cl₂HCL, and H₂ at about 908° C. for about 75 sec at a pressure of about 40 T. The process parameters for the reactants are as follows: about 200 sccm of SiH₂Cl₂, about 260 sccm of HCL, and 65 slm of H₂.

Figure 15:
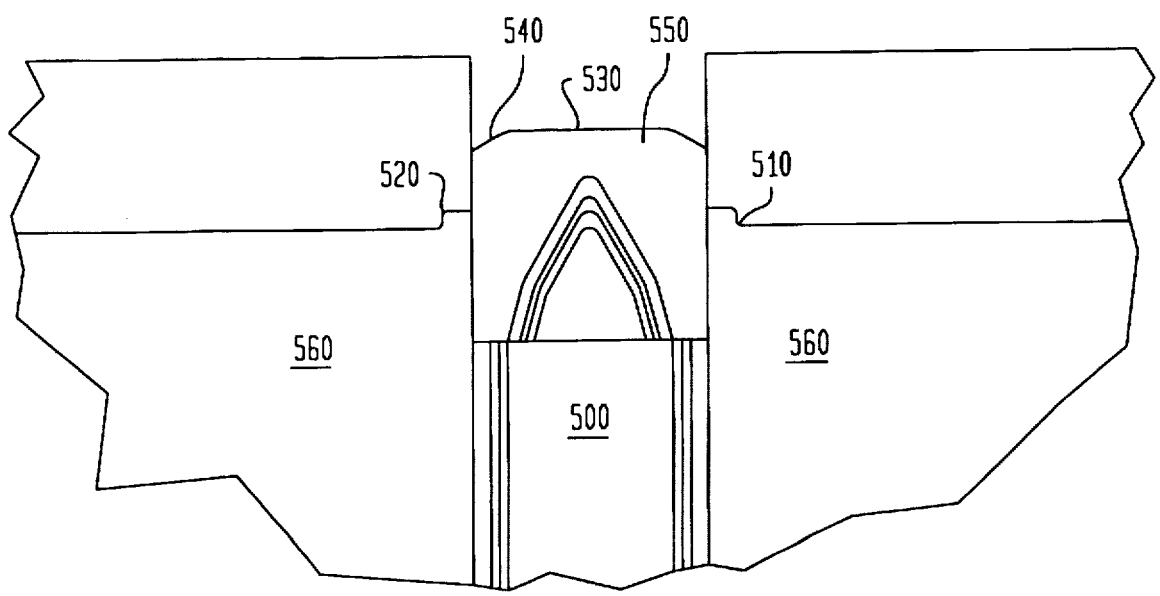
FIG. 15 is a TEM of epitaxial silicon layer capping a polysilicon filled trench.

FIG. 15 is a transmission Electron Micrograph (TEM) image of the trench 500 as fabricated from the above experiment. As shown, the poly 520 grows from the top of the trench, and the epi 510 grows from the trench sidewalls 560. The poly-epi interface 530 forms an angle of about 54° with the <100> wafer surface, creating a cone shaped poly growth. Because of the slower growth rate of the epi at the trench sidewalls, the epi surface 550 has a convex shape with <311> facets 540 near the trench sidewalls.

Example 2

Figure 16:
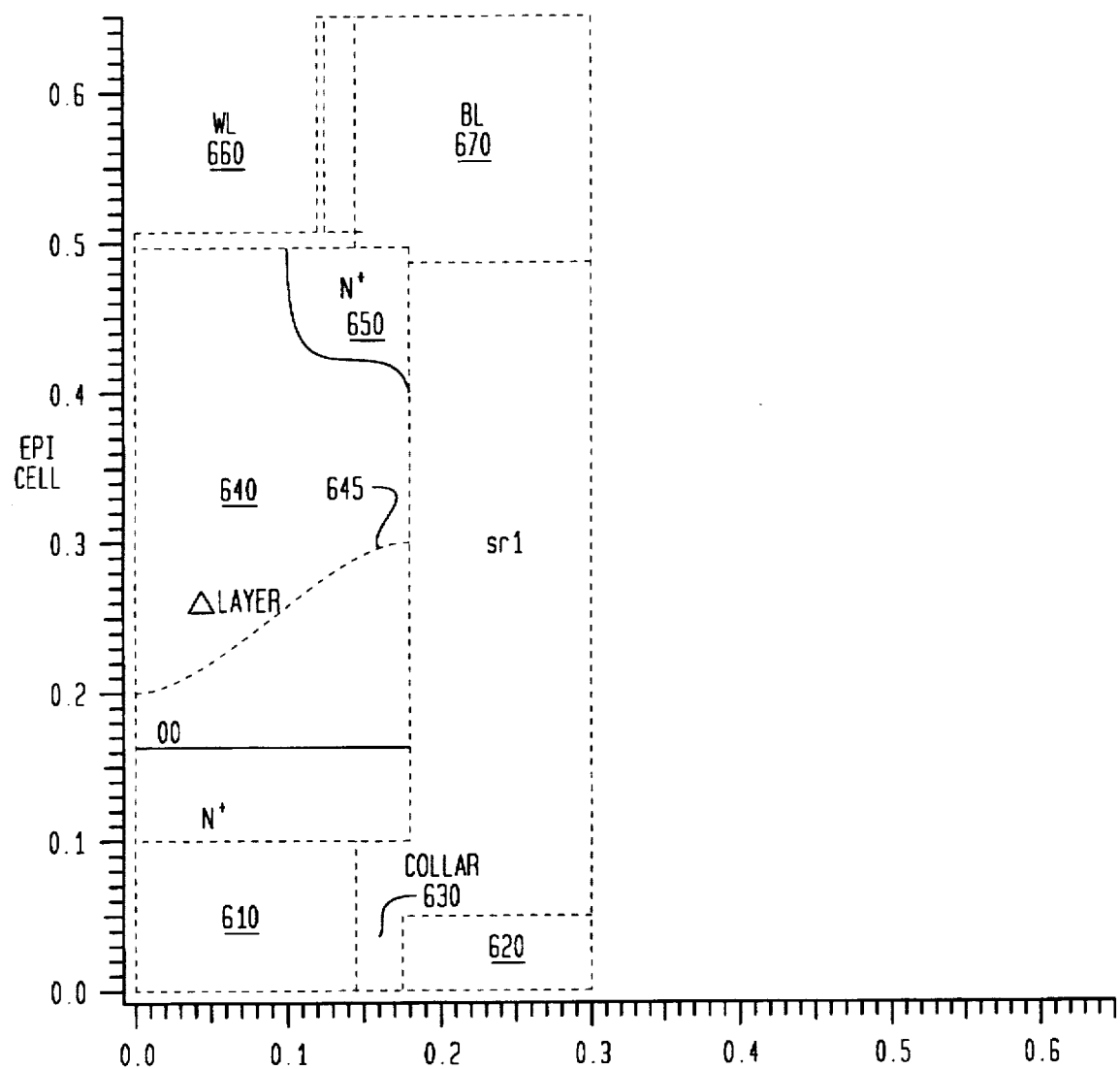
FIG. 16 is a model depicting the three-dimensional structure of FIG. 3.

An experiment was conducted to determine the effectiveness of the delta doping layer in reducing punch through. Referring to FIG. 16, a model depicting a three-dimensional structure 600, such as one used in a DRAM array. Structure 600 is similar to the three-dimensional structure described in FIG. 3. The model depicted includes the bitline diffusion 650. The numbers on the side and bottom represent the dimensions of the cell. As shown, the trench capacitor 610 is isolated from the silicon substrate 620 by a collar 630. On top of the trench capacitor is an epi layer 640 formed in accordance with the invention. The epi layer incorporates a delta doping layer formed within the epi layer. The delta layer is doped with B at a concentration of about $5 \times 10^{17}$ cm$^3$. STI region isolates the structure 600 from other structures in the DRAM array. Above the epi layer is the wordline 660 and bitline 670. The bitline is connected to the transistor by the bitline diffusion. Two other DRAM cells similar to DRAM cell 600 were also modeled. The first included a delta layer doped with about $2 \times 10^{18}$ cm$^3$ of B and the second was modeled without a delta layer.

Figure 17:
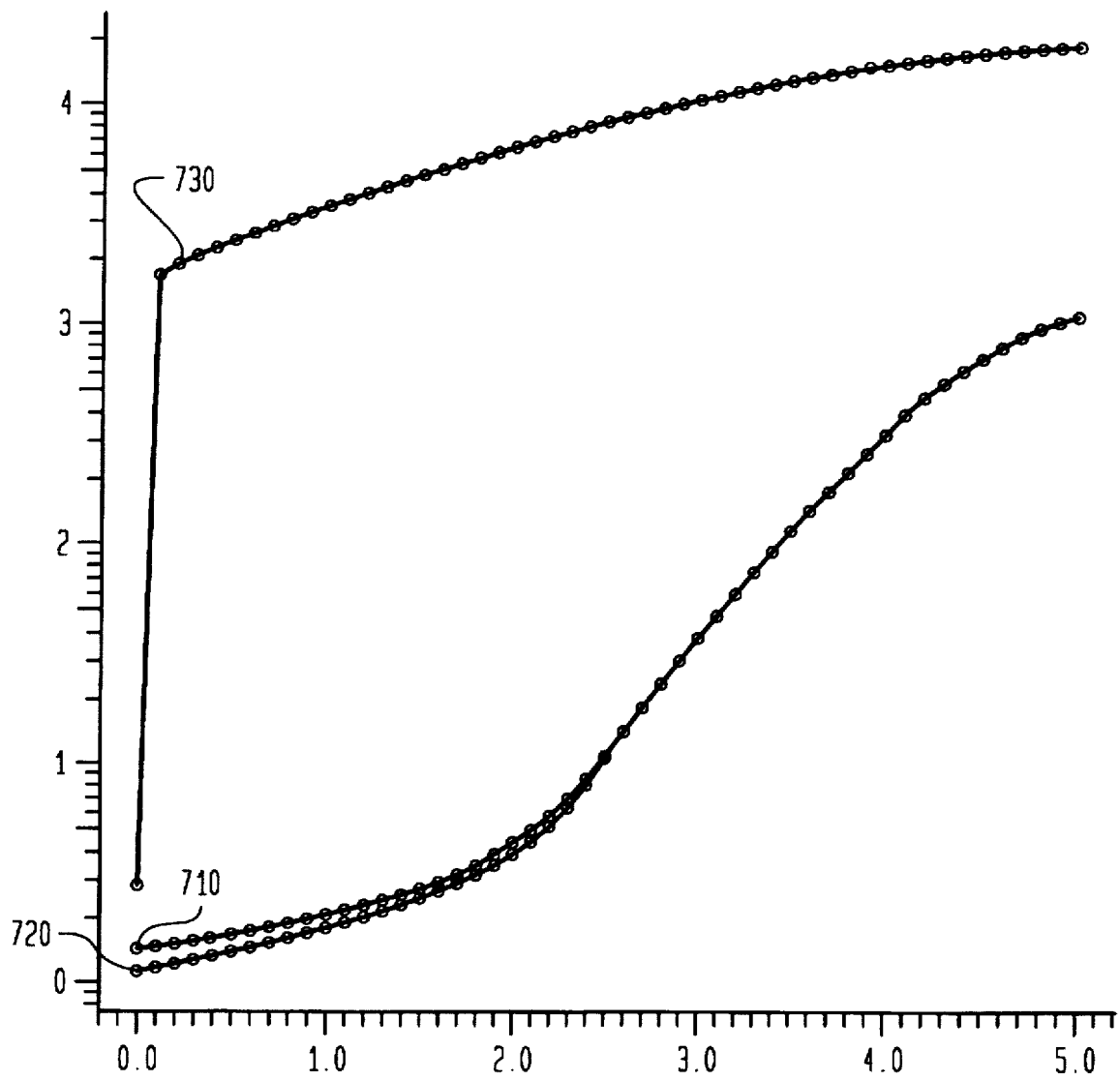
FIG. 17 shows total leakage currents of three-dimensional models of structures with and without a delta layer.

The DRAM cell models were simulated to measure the leakage current from the node of the trench capacitor 610 to the bitline 670 overlying the bitline diffusion 650. The simulations were conducted a finite element device simulator as described in Buturla et al., "A New Three-Dimensional Device Simulation Formulation", NASCODE: Proc. 6th Inter. Conf. Numerical Analysis of Semiconductor Devices and Integrated Circuits, Boole Press Ltd. (1989). Referring to FIG. 17, the logarithmic total leakage current of the DRAM cell models is plotted against voltage on the storage node with the bitline at 0.0 volts. Although the plot measures leakage current up to 5.0 V, most conventional high density DRAM arrays use about 1.8–2.0 V. Curves 710 and 720 represent the leakage current from the models having delta layers doped with $2 \times 10^{18}$ cm$^3$ and $5 \times 10^{18}$ cm$^3$ of B, respectively; Curve 730 represents the leakage current from models having no delta layer. Clearly, the models with the delta layers (curves 710 and 720) show significantly less leakage current than the model without the delta layer (curve 730). In particular, the delta layer effectively reduces the amount of leakage current to about 3 orders of magnitude less at levels at or below about 2 V. The reduction of leakage current indicates that the structure meets the target for low power, long retention time applications. Thus, for most current high density DRAM applications, the delta layer effectively reduces or eliminates punch through.

While the invention has been particularly shown and described with reference to various embodiments, it will be recognized by those skilled in the art that modifications and changes may be made to the present invention without departing from the spirit and scope thereof. Merely by way of example, the three-dimensional structure can be implemented with P-channel transistors. The scope of the invention should therefore be determined not with reference to the above description but with reference to the appended claims along with their full scope of equivalents.

We claim:

1. In a dynamic random access memory (DRAM) device, a process for forming a DRAM cell comprising a transistor having a sub-groundrule gate above a capacitor, the process comprises:

providing a semiconductor substrate having a capacitor formed in a capacitor region defined therein, wherein the capacitor comprises polycrystalline material;

removing a top portion of the capacitor to form a recess below a top surface of the semiconductor substrate;

growing a silicon layer in the recess by epitaxial growth to substantially fill the recess, wherein a top surface of the silicon layer is substantially single crystalline on which the transistor is fabricated;

depositing a wordline conductor layer over the surface of the semiconductor substrate;

depositing a mandrel layer over the conductor layer and patterning the mandrel layer to form a mandrel such that a side edge of the mandrel overlaps a portion of the capacitor region of the DRAM cell;

forming a spacer on the side edge of the mandrel wherein the spacer defines a gate region over the capacitor region and non-gate regions adjacent to the gate region removing said mandrel;

forming the sub-groundrule gate in the defined gate region by selectively removing portions of said wordline layer from the non-gate regions, wherein the sub-groundrule gate enables the transistor to be formed over the capacitor region of a capacitor; and removing said spacer.

* * * * *